(12) United States Patent
Chen et al.

(10) Patent No.: US 10,490,216 B1
(45) Date of Patent: Nov. 26, 2019

(54) MAGNETIC FLUX GUIDING DEVICE WITH ANTIFERROMAGNETICALLY COUPLED (AFC) OSCILLATOR IN ASSISTED WRITING APPLICATION

(71) Applicant: Headway Technologies, Inc., Milpitas, CA (US)

(72) Inventors: Wenyu Chen, San Jose, CA (US); Shohei Kawasaki, Sunnyvale, CA (US); Tetsuya Roppongi, San Jose, CA (US); Yan Wu, Cupertino, CA (US)

(73) Assignee: Headway Technologies, Inc., Milpitas, CA (US)

( * ) Notice: Subject to any disclaimer, the term of this patent is extended or adjusted under 35 U.S.C. 154(b) by 0 days.

(21) Appl. No.: 16/209,151

(22) Filed: Dec. 4, 2018

(51) Int. Cl.
　　*G11B 5/31*　　　(2006.01)
　　*G11B 5/127*　　 (2006.01)
　　*G01R 33/09*　　 (2006.01)
　　*G11C 11/16*　　 (2006.01)
　　*G11B 5/00*　　　(2006.01)

(52) U.S. Cl.
　　CPC .......... *G11B 5/3146* (2013.01); *G01R 33/093* (2013.01); *G11B 5/1278* (2013.01); *G11B 5/314* (2013.01); *G11C 11/16* (2013.01); *G11B 2005/0024* (2013.01)

(58) Field of Classification Search
　　CPC ............................ G11B 5/3146; G11B 5/1278
　　USPC ......................................... 360/125.3–125.35
　　See application file for complete search history.

(56) References Cited

U.S. PATENT DOCUMENTS

| | | |
|---|---|---|
| 6,785,092 B2 | 8/2004 | Covington et al. |
| 6,809,899 B1 | 10/2004 | Chen et al. |
| 6,954,340 B2 | 10/2005 | Shukh et al. |
| 7,009,812 B2 | 3/2006 | Hsu et al. |

(Continued)

FOREIGN PATENT DOCUMENTS

| | | |
|---|---|---|
| JP | 2002-133610 | 5/2002 |
| JP | 2002-298309 | 10/2002 |

(Continued)

OTHER PUBLICATIONS

PTO Office Action, U.S. Appl. No. 12/964,202, Applicant: Sasaki et al., dated Nov. 28, 2012, 11 pages.

(Continued)

*Primary Examiner* — Allen T Cao
(74) *Attorney, Agent, or Firm* — Saile Ackerman LLC; Stephen B. Ackerman

(57) ABSTRACT

A spin torque transfer (STO) assisted magnetic recording structure is disclosed wherein a STO device has capability to generate a radio frequency (RF) field on a magnetic bit to lower the required write field during a write process. The STO device contains a field generation layer (FGL) with a magnetization that flips to a direction opposite to the write gap field when a current of sufficient current density is applied thereby increasing reluctance in the write gap and causing a larger write field output at the air bearing surface. A key feature is that a single spin polarization (SP) layer and an antiferromagnetically coupled SP layer comprised of SP1 and SP2 layers are formed on opposite sides of the FGL. SP1 magnetization is greater than SP2 magnetization. Additive torque from SP and SP2 layers on the FGL enables FGL flipping while SP1 and SP2 precessional states provide the RF field.

36 Claims, 14 Drawing Sheets

(56) References Cited

U.S. PATENT DOCUMENTS

| | | | |
|---|---|---|---|
| 7,589,600 B2 | 9/2009 | Dimitrov et al. | |
| 7,724,469 B2 | 5/2010 | Gao et al. | |
| 7,835,111 B2 | 11/2010 | Flint et al. | |
| 7,957,098 B2 | 6/2011 | Yamada et al. | |
| 7,963,024 B2 | 6/2011 | Neuhaus | |
| 7,978,442 B2 | 7/2011 | Zhang et al. | |
| 7,982,996 B2 | 7/2011 | Smith et al. | |
| 8,027,110 B1 | 9/2011 | Yamanaka et al. | |
| 8,064,244 B2 | 11/2011 | Zhang et al. | |
| 8,068,312 B2 | 11/2011 | Jiang et al. | |
| 8,154,825 B2 | 4/2012 | Takashita et al. | |
| 8,203,389 B1 | 6/2012 | Zhou et al. | |
| 8,264,792 B2 | 9/2012 | Bai et al. | |
| 8,270,112 B2 | 9/2012 | Funayama et al. | |
| 8,295,008 B1 | 10/2012 | Sasaki et al. | |
| 8,310,787 B1 | 11/2012 | Sasaki et al. | |
| 8,320,079 B2 | 11/2012 | Iwasaki et al. | |
| 8,427,781 B1 | 4/2013 | Sasaki et al. | |
| 8,446,690 B2 | 5/2013 | Alex et al. | |
| 8,462,461 B2 | 6/2013 | Braganca et al. | |
| 8,477,452 B2 | 7/2013 | Sasaki et al. | |
| 8,493,687 B2 | 7/2013 | Sasaki et al. | |
| 8,582,240 B1 | 11/2013 | Chen et al. | |
| 8,582,241 B1 | 11/2013 | Yu et al. | |
| 8,604,886 B2 | 12/2013 | Nikonov et al. | |
| 8,634,163 B2 | 1/2014 | Tanabe et al. | |
| 8,749,919 B2 | 6/2014 | Sasaki et al. | |
| 8,767,347 B1 | 7/2014 | Sasaki et al. | |
| 8,792,210 B2 | 7/2014 | de la Fuente et al. | |
| 9,142,228 B2 | 9/2015 | Fujita et al. | |
| 9,230,571 B1 | 1/2016 | Chen et al. | |
| 9,299,367 B1 | 3/2016 | Tang et al. | |
| 9,355,654 B1* | 5/2016 | Mallary | G11B 5/1278 |
| 9,355,655 B1* | 5/2016 | Udo | G11B 5/1278 |
| 9,361,912 B1 | 6/2016 | Liu et al. | |
| 9,406,317 B1 | 8/2016 | Tang et al. | |
| 9,466,319 B1 | 10/2016 | Tang et al. | |
| 9,824,701 B2 | 11/2017 | Tang et al. | |
| 9,934,797 B2 | 4/2018 | Takahashi et al. | |
| 9,966,091 B2 | 5/2018 | Chen et al. | |
| 10,032,469 B2 | 7/2018 | Lim et al. | |
| 10,037,772 B2 | 7/2018 | Okamura et al. | |
| 10,366,714 B1* | 7/2019 | Olson | G11B 5/3929 |
| 2002/0034043 A1 | 3/2002 | Okada et al. | |
| 2004/0150910 A1 | 8/2004 | Okada et al. | |
| 2005/0128637 A1 | 6/2005 | Johnston et al. | |
| 2005/0141137 A1 | 6/2005 | Okada et al. | |
| 2006/0044682 A1 | 3/2006 | Le et al. | |
| 2006/0087765 A1 | 4/2006 | Iwakura et al. | |
| 2006/0103978 A1 | 5/2006 | Takano et al. | |
| 2007/0177301 A1 | 8/2007 | Han et al. | |
| 2008/0013209 A1 | 1/2008 | Sasaki et al. | |
| 2008/0088972 A1 | 4/2008 | Sasaki et al. | |
| 2009/0059426 A1 | 3/2009 | Sasaki et al. | |
| 2009/0080106 A1 | 3/2009 | Shimizu et al. | |
| 2009/0128953 A1 | 5/2009 | Jiang et al. | |
| 2009/0296275 A1 | 12/2009 | Sasaki et al. | |
| 2010/0165517 A1 | 7/2010 | Araki et al. | |
| 2011/0211271 A1 | 9/2011 | Ng et al. | |
| 2011/0279921 A1* | 11/2011 | Zhang | B82Y 10/00 360/59 |
| 2012/0126905 A1* | 5/2012 | Zhang | G11B 5/3146 331/94.1 |
| 2012/0292723 A1 | 11/2012 | Luo et al. | |
| 2013/0082787 A1* | 4/2013 | Zhang | C23C 14/025 331/107 R |
| 2014/0071562 A1 | 3/2014 | Chen et al. | |
| 2014/0133048 A1* | 5/2014 | Shiimoto | G11B 5/127 360/75 |
| 2014/0177092 A1* | 6/2014 | Katada | G11B 5/314 360/75 |
| 2015/0043106 A1 | 2/2015 | Yamada et al. | |
| 2015/0124347 A1* | 5/2015 | Shimoto | G11B 5/1278 360/71 |
| 2016/0086623 A1* | 3/2016 | Nagasaka | G11B 5/235 360/125.3 |
| 2016/0218728 A1* | 7/2016 | Zhu | G11B 5/235 |
| 2017/0133044 A1 | 5/2017 | Lim et al. | |
| 2017/0309301 A1* | 10/2017 | Takahashi | G11B 5/3912 |
| 2018/0075868 A1 | 3/2018 | Koui et al. | |

FOREIGN PATENT DOCUMENTS

| | | |
|---|---|---|
| JP | 2008-021398 | 1/2008 |
| JP | 2010-157303 | 7/2010 |

OTHER PUBLICATIONS

"The Feasibility of Magnetic Recording at 10 Terabits Per Square Inch on Conventional Media," by Roger Wood et al., IEEE Transactions on Magnetics, vol. 45, No. 2, Feb. 2009, pp. 917-923.

Microwave Assisted Magnetic Recording, by Jian-Gang Zhu et al., IEEE Transactions on Magnetics, vol. 44, No. 1, Jan. 1, 2008, pp. 125-131.

Nov. 13, 2012, Office Action issued in Japanese Patent Application No. 2011-149242, with English language translation.

Nov. 13, 2012, Office Action issued in Japanese Patent Application No. 2011-149243, with English language translation.

Nov. 13, 2012, Office Action issued in Japanese Patent Application No. 2011-149244, with English language translation.

"Spin-Torque Oscillator Based on Magnetic Tunnel Junction with a Perpendicularly Magnetized Free Layer and In-Plane Magnetized Polarizer," by Hitoshi Kubota, et al., 2013 The Japan Society of Applied Physics, Applied Physics Express 6 (2013) 103003, Sep. 27, 2013, pp. 1-3.

"High-Power Coherent Microwave Emission from Magnetic Tunnel Junction Nano-oscillators with Perpendicular Anisotropy," by Zhongming Zeng, et al, 2012 American Chemical Society, Jun. 4, 2012, vol. 6, No. 7, pp. 6115-6121.

* cited by examiner

MAGNETIC FLUX GUIDING DEVICE WITH ANTIFERROMAGNETICALLY COUPLED (AFC) OSCILLATOR IN ASSISTED WRITING APPLICATION

RELATED PATENT APPLICATIONS

This application is related to the following: U.S. Pat. No. 9,966,091; Ser. No. 16/037,197, filed on Jul. 17, 2018; Ser. No. 16/197,586, filed on Nov. 21, 2018; assigned to a common assignee, and herein incorporated by reference in their entirety.

TECHNICAL FIELD

The present disclosure relates to a design for a spin torque (STO) device that enables a dual function of spin torque magnetic layer reversal assisted magnetic recording and microwave assisted magnetic recording (MAMR) wherein a flux guiding layer (FGL) magnetization flips to an opposite direction as a result of spin torque from adjacent spin polarization (SP) layers when a current ($I_a$) of sufficient density is applied thereby enhancing the main pole write field, and wherein first and second spin polarization (SP1 and SP2) layers in an antiferromagnetic (AF) coupling configuration oscillate to provide a MAMR effect on one or more magnetic bits.

BACKGROUND

As the data areal density in hard disk drive (HDD) writing increases, write heads and media bits are both required to be made in smaller sizes. However, as the write head size shrinks, its writability degrades. To improve writability, new technology is being developed that assists writing to a media bit. Two main approaches currently being investigated are thermally assisted magnetic recording (TAMR) and microwave assisted magnetic recording (MAMR). The latter is described by J-G. Zhu et al. in "Microwave Assisted Magnetic Recording", IEEE Trans. Magn., vol. 44, pp. 125-131 (2008). MAMR uses a spin torque device to generate a high frequency field that reduces the coercive field of a medium bit thereby allowing the bit to be switched with a lower main pole field.

Spin transfer torque devices (also known as STO devices) are based on a spin-transfer effect that arises from the spin dependent electron transport properties of ferromagnetic-spacer-ferromagnetic multilayers. When a spin-polarized current passes through a magnetic multilayer in a CPP (current perpendicular to plane) configuration, the spin angular moment of electrons incident on a ferromagnetic layer interacts with magnetic moments of the ferromagnetic layer near the interface between the ferromagnetic and non-magnetic spacer. Through this interaction, the electrons transfer a portion of their angular momentum to the ferromagnetic layer. As a result, spin-polarized current can switch the magnetization direction of the ferromagnetic layer if the current density is sufficiently high. STO devices are also referred to as one of the spintronic devices and have ferromagnetic (FM) layers that may have a perpendicular magnetic anisotropy (PMA) component where magnetization is aligned substantially perpendicular to the plane of the FM layer. However, unlike Magnetoresistive Random Access Memory (MRAM) where PMA is necessary to keep magnetization perpendicular to plane in a free layer and reference layer, for example, STO in MAMR and related applications has a sufficiently strong write gap field to align magnetization in magnetic layers without requiring inherent PMA in the layers.

MAMR typically operates with the application of a bias current from the main pole across the STO device to a trailing shield, or vice versa, in order to apply spin torque on an oscillation layer (OL) so that the OL's oscillation generates a high frequency RF field. The RF field induces a precessional state and lower coercivity in a magnetic bit to be written in a magnetic medium. Simultaneously, a write field from the main pole is applied from an air bearing surface (ABS) to the magnetic medium, and lower field strength is needed to write the bit because of the RF field assist. In spin-torque-assisted FGL reversal schemes, FGL magnetization flips to an opposite direction when the applied current is sufficiently large enough thereby increasing the write gap reluctance, which causes a greater write field output. Both MAMR and magnetic reversal typically require a relatively high current density ($>10^8$ A/cm$^2$) to in order to apply a useful spin torque effect for generating a RF field or for FGL flipping. The oscillation cone angle in the FGL becomes smaller with increasing current density to substantially shrink the MAMR effect. Accordingly, no STO design exists that enables a substantial spin-torque-induced FGL reversal effect while simultaneously providing a significant MAMR effect. Thus, an improved STO device is needed with a structure that allows both of the spin-torque-induced FGL reversal assist effect and MAMR effect for improved write performance over a structure where only one of spin torque assist and MAMR is applied and the other is essentially ineffective.

SUMMARY

One objective of the present disclosure is to provide a STO device that enables both of a spin-torque-induced reversal effect on a FGL magnetization to enhance the write field at a given bias current density, and a MAMR effect in order to reduce the write field needed to write a magnetic bit.

A second objective of the present disclosure is to provide a method of forming the STO device according to the first objective.

According to the embodiments of the present invention, these objectives are achieved with a writer design having a STO device (magnetic flux guiding device) formed between a main pole and a trailing shield, and within a write gap. Leads from the main pole and trailing shield are connected to a direct current (dc) source that provides an applied current ($I_a$) across the STO device during a write process.

According to a first embodiment, the STO device has a stack of layers with a seed layer, an antiferromagnetically coupled (AFC) SP layer, first non-magnetic spacer (NM1), FGL, second non-magnetic spacer (NM2), and a second (top) SP layer sequentially formed on a main pole (MP) tapered trailing side at the ABS to yield a seed/AFC SP/NM1/FGL/NM2/SP configuration. The AFC SP layer has a SP1/AF coupling/SP2 configuration wherein the first SP sub-layer (SP1) is formed on the seed layer. Since the seed layer is sufficiently thick to magnetically decouple the MP and SP1, SP1 magnetization is aligned towards the gap field from the MP, but not exactly parallel to the gap field direction since SP1 magnetization is also scissored with an offset angle by the SP2 layer via the Ru AFC layer. The second SP sub-layer (SP2) has a magnetization antiparallel to that of SP1, and adjoins NM1. Moreover, SP1 has a larger moment than SP2.

The top SP layer has a magnetization that is substantially antiparallel to SP2 magnetization although not exactly antiparallel. The top SP layer is aligned to the gap field, but SP2 magnetization is aligned towards the antiparallel direction, but is also offset by the strong gap field, which is typically on the order of >1 T. Thus, the top SP magnetization is substantially parallel to SP1 and FGL magnetizations and to the trailing shield (TS) magnetization in a portion of the TS at the STO top surface in the absence of an applied current. When a current ($I_a$) of sufficient magnitude (density) is applied from the trailing shield (TS) to the MP across the STO device during a write process, FGL magnetization flips to an opposite direction (opposite to the write gap field) as a result of spin torque from the top SP layer and SP2 layer (but mostly from top SP layer) thereby enhancing the write field on the magnetic medium. Furthermore, the SP1 and SP2 layers each enter a precessional state wherein an oscillation generates a RF field on one or more magnetic bits in the magnetic medium to provide a MAMR effect during the write process. Thus, writability is improved because of a higher write field output from the MP, and a reduced write field that is required to switch magnetization in a plurality of magnetic bits.

In a second embodiment, the features of the first embodiment are retained except the positions of the SP and AFC SP layers are switched, and the bottom seed layer is replaced with an uppermost capping layer to give a SP/NM2/FGL/NM1/AFC SP/capping layer configuration. Here, the SP layer contacts the MP, and SP1 is the uppermost layer in the AFC SP configuration and contacts the capping layer, which adjoins the trailing shield. At a certain current density (where current $I_a$ flows from the MP to TS), spin torque from the SP layer and SP2 layer causes FGL magnetization to flip, and SP1 and SP2 oscillate to generate a MAMR effect on a magnetic bit in the adjacent magnetic medium. Writability is improved over a prior art STO device with only one FGL and one SP, and compared with a related STO device where only the spin torque effect is used and the MAMR functionally is essentially non-existent.

There is a third embodiment that is a modification of the first embodiment. In particular, the single SP layer contacting the TS is merged into the TS so that TS magnetization proximate to the STO top surface and the SP2 layer exert spin torque on the FGL when current $I_a$ is applied from the TS to MP. Other features of the first embodiment are retained including the AF coupled SP1 and SP2 layers that enter a precessional state to provide a MAMR effect during a write process.

The fourth embodiment is a modification of the second embodiment. In this case, the single SP layer is merged into the MP so that MP magnetization proximate to the STO bottom surface and the SP2 layer exert a spin torque on the FGL when current $I_a$ is applied from the MP to TS thereby causing FGL magnetization to flip. At the same time, SP1 and SP2 layers enter a precessional state to generate a MAMR effect on one or more magnetic bits in a write process.

The present disclosure also encompasses a process flow for forming a STO device between a MP and TS according to an embodiment described herein.

DETAILED DESCRIPTION

Figure 1:
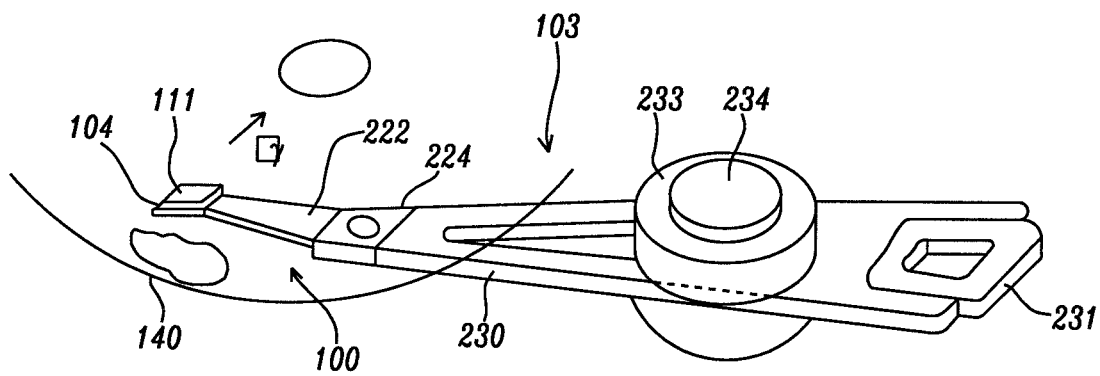
FIG. 1 is a perspective view of a head arm assembly of the present disclosure.

The present disclosure is a writer structure wherein a STO device that enables both of a spin-torque-induced effect for FGL flipping, and a MAMR effect on adjacent magnetic bits in a magnetic medium, is formed between a main pole and a first trailing shield, and a process for making the same. In the drawings, the y-axis is in a cross-track direction, the z-axis is in a down-track direction, and the x-axis is in a direction orthogonal to the ABS and towards a back end of the writer structure. Thickness refers to a down-track distance, width is a cross-track distance, and height is a distance from the ABS in the x-axis direction. In some of the drawings, a magnetic bit is considerably enlarged over actual size in order to more easily depict a magnetization therein. The terms "magnetic moment" and "magnetization" may be used interchangeably. The term "higher degree of flipping" means that FGL magnetization is flipped closer to a direction that is perpendicular to the plane of the FGL and with a smaller cone angle in a precessional state.

Referring to FIG. 1, a head gimbal assembly (HGA) 100 includes a magnetic recording head 111 comprised of a slider and a PMR writer structure formed thereon, and a suspension 103 that elastically supports the magnetic recording head. The suspension has a plate spring-like load beam 222 formed with stainless steel, a flexure 104 provided at one end portion of the load beam, and a base plate 224 provided at the other end portion of the load beam. The slider portion of the magnetic recording head is joined to the flexure, which gives an appropriate degree of freedom to the magnetic recording head. A gimbal part (not shown) for maintaining a posture of the magnetic recording head at a steady level is provided in a portion of the flexure to which the slider is mounted.

HGA 100 is mounted on an arm 230 formed in the head arm assembly 103. The arm moves the magnetic recording head 111 in the cross-track direction y of the magnetic recording medium 140. One end of the arm is mounted on base plate 224. A coil 231 that is a portion of a voice coil motor is mounted on the other end of the arm. A bearing part 233 is provided in the intermediate portion of arm 230. The arm is rotatably supported using a shaft 234 mounted to the bearing part 233. The arm 230 and the voice coil motor that drives the arm configure an actuator.

Figure 2:
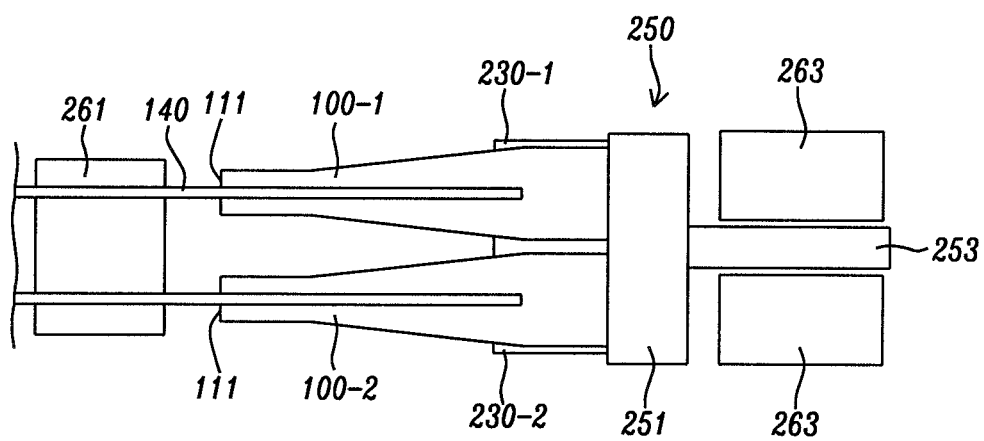
FIG. 2 is side view of a head stack assembly of the present disclosure.

Next, a side view of a head stack assembly (FIG. 2) and a plan view of a magnetic recording apparatus (FIG. 3) wherein the magnetic recording head 111 is incorporated are depicted. The head stack assembly 250 is a member to which a first HGA 100-1 and second HGA 100-2 are mounted to arms 230-1, 230-2, respectively, on carriage 251. A HGA is mounted on each arm at intervals so as to be aligned in the perpendicular direction (orthogonal to magnetic medium 140). The coil portion (231 in FIG. 1) of the voice coil motor is mounted at the opposite side of each arm in carriage 251. The voice coil motor has a permanent magnet 263 arranged at an opposite position across the coil 231.

Figure 3:
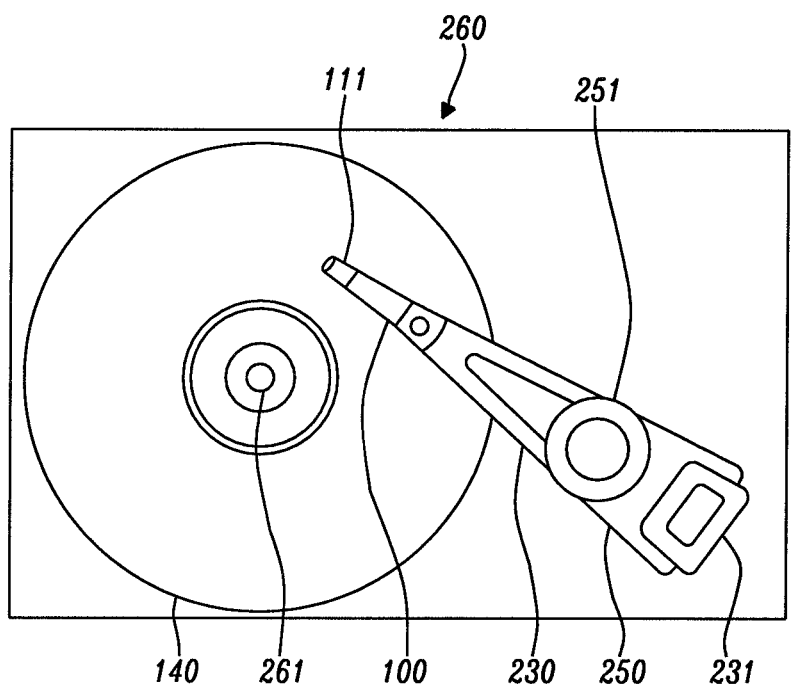
FIG. 3 is a plan view of a magnetic recording apparatus of the present disclosure.

With reference to FIG. 3, the head stack assembly 250 is incorporated in a magnetic recording apparatus 260. The magnetic recording apparatus has a plurality of magnetic media 140 mounted to spindle motor 261. For every magnetic recording medium, there are two magnetic recording heads arranged opposite one another across the magnetic recording medium. The head stack assembly and actuator except for the magnetic recording heads 111 correspond to a positioning device, and support the magnetic recording heads, and position the magnetic recording heads relative to the magnetic recording medium. The magnetic recording heads are moved in a cross-track of the magnetic recording medium by the actuator. The magnetic recording head records information into the magnetic recording media with a PMR writer element (not shown) and reproduces the information recorded in the magnetic recording media by a magnetoresistive (MR) sensor element (not shown).

Figure 4:
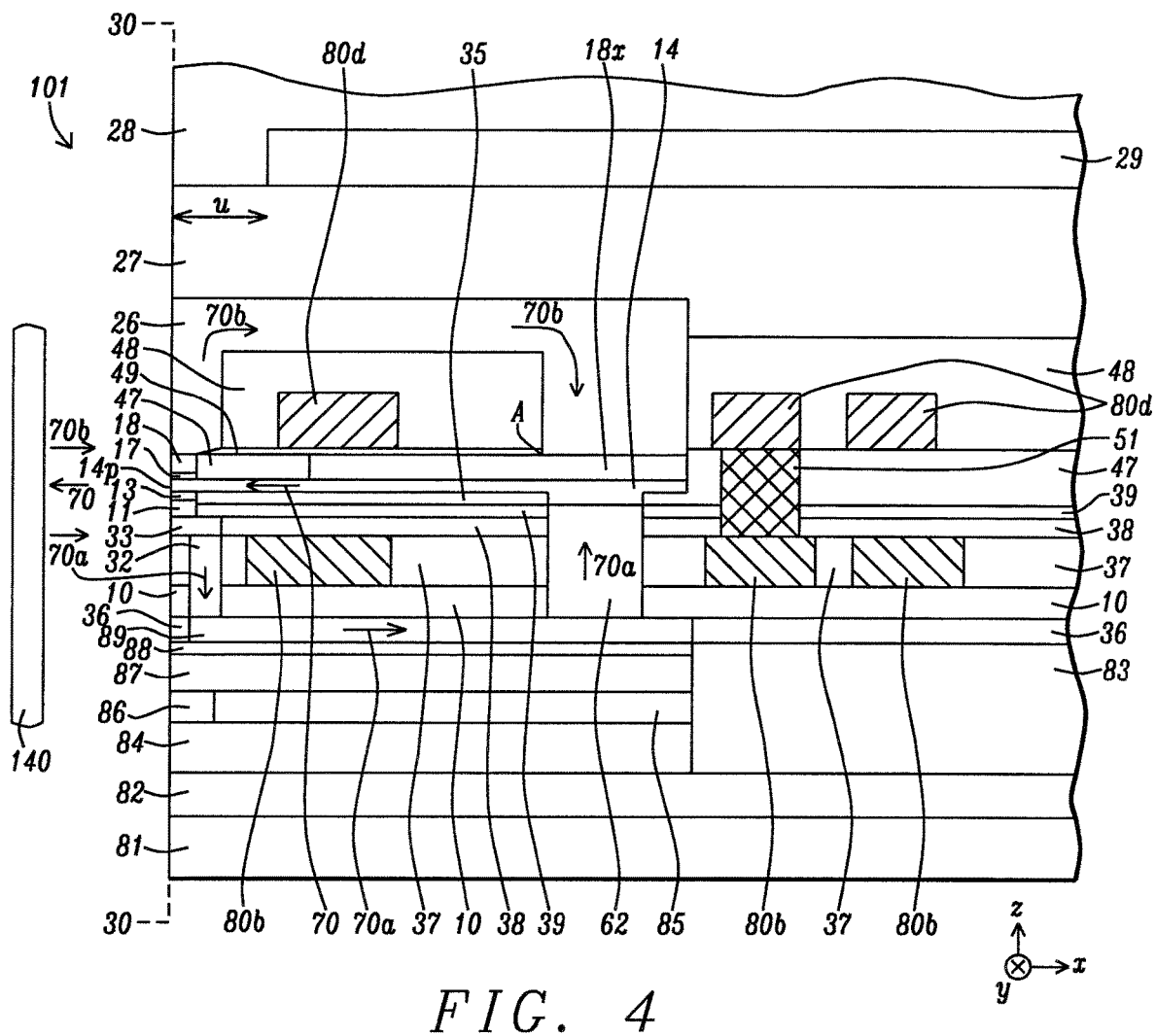
FIG. 4 is a down-track cross-sectional view of a combined read-write head with leading and trailing loop pathways for magnetic flux return to the main pole according to an embodiment of the present disclosure.

Referring to FIG. 4, magnetic recording head 101 comprises a combined read-write head. The down-track cross-sectional view is taken along a center plane (44-44 in FIG. 16A) formed orthogonal to the ABS 30-30, and that bisects the main pole layer 14. The read head is formed on a substrate 81 that may be comprised of AlTiC (alumina+TiC) with an overlying insulation layer 82 that is made of a dielectric material such as alumina. The substrate is typically part of a slider formed in an array of sliders on a wafer. After the combined read head/write head is fabricated, the wafer is sliced to form rows of sliders. Each row is typically lapped to afford an ABS before dicing to fabricate individual sliders that are used in a magnetic recording device. A bottom shield 84 is formed on insulation layer 82.

A magnetoresistive (MR) element also known as MR sensor 86 is formed on bottom shield 84 at the ABS 30-30 and typically includes a plurality of layers (not shown) including a tunnel barrier formed between a pinned layer and a free layer where the free layer has a magnetization (not shown) that rotates in the presence of an applied magnetic field to a position that is parallel or antiparallel to the pinned layer magnetization. Insulation layer 85 adjoins the backside of the MR sensor, and insulation layer 83 contacts the backsides of the bottom shield and top shield 87. The top shield is formed on the MR sensor. An insulation layer 88 and a top shield (S2B) layer 89 are sequentially formed on the top magnetic shield. Note that the S2B layer 89 may serve as a flux return path (RTP) in the write head portion of the combined read/write head. Thus, the portion of the combined read/write head structure formed below layer 89 in FIG. 4 is typically considered as the read head. In other embodiments (not shown), the read head may have a dual reader design with two MR sensors, or a multiple reader design with multiple MR sensors.

The present disclosure anticipates that various configurations of a write head may be employed with the read head portion. In the exemplary embodiment, magnetic flux 70 in main pole (MP) layer 14 is generated with flowing a current through bucking coil 80b and driving coil 80d that are below and above the main pole layer, respectively, and are connected by interconnect 51. Magnetic flux 70 exits the main pole layer at pole tip 14p at the ABS 30-30 and is used to write a plurality of bits on magnetic media 140. Magnetic flux 70b returns to the main pole through a trailing loop comprised of trailing shields 17, 18, PP3 shield 26, and top yoke 18x. There is also a leading return loop for magnetic flux 70a that includes leading shield 11, leading shield connector (LSC) 33, S2C 32, return path 89, and back gap connection (BGC) 62. The magnetic core may also comprise a bottom yoke 35 below the main pole layer. Dielectric layers 10, 11, 13, 36-39, and 47-49 are employed as insulation layers around magnetic and electrical components. A protection layer 27 covers the PP3 trailing shield and is made of an insulating material such as alumina. Above the protection layer and recessed a certain distance u from the ABS 30-30 is an optional cover layer 29 that is preferably comprised of a low coefficient of thermal expansion (CTE)

material such as SiC. Overcoat layer 28 is formed as the uppermost layer in the write head.

Figure 5A:
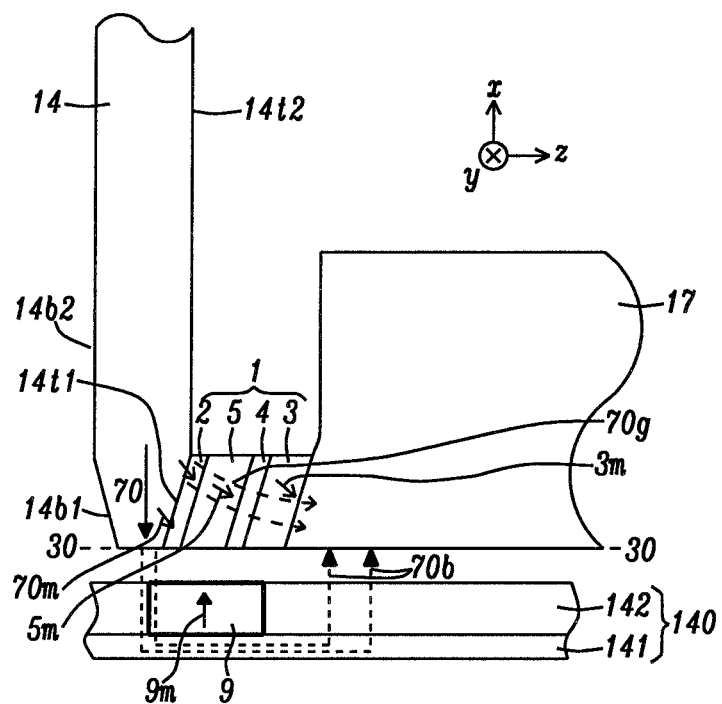
FIGS. 5A-5B and FIGS. 6A-6B show STO devices known to the inventors wherein a single SP layer is used to exert a torque to drive the FGL into a precessional state when a critical current is applied across the STO device.

Referring to FIG. 5A, a MAMR writer known to the inventors, and essentially equivalent to the writer structure in related U.S. Pat. No. 9,966,091, is depicted. There is a main pole 14 with a sufficiently large local magnetic field 70 to write the media bit 9 with magnetization 9m on medium 140. Magnetic flux 70 in the main pole proceeds through the ABS 30-30 and into medium bit layer 142 and soft underlayer (SUL) 141. A portion of the flux 70b is collected by trailing shield 17 and then returns to the MP through a trailing loop (shown in FIG. 4). STO device 1 is at the ABS and formed on the MP tapered trailing side 14t1, which connects with a MP top surface 14t2 that is aligned orthogonal to the ABS. The MP leading side 14b1 is also tapered and connects with the MP bottom surface 14b2. Write gap field 70g is shown across the STO in a direction from the MP to trailing shield (TS) 17.

Figure 5B:
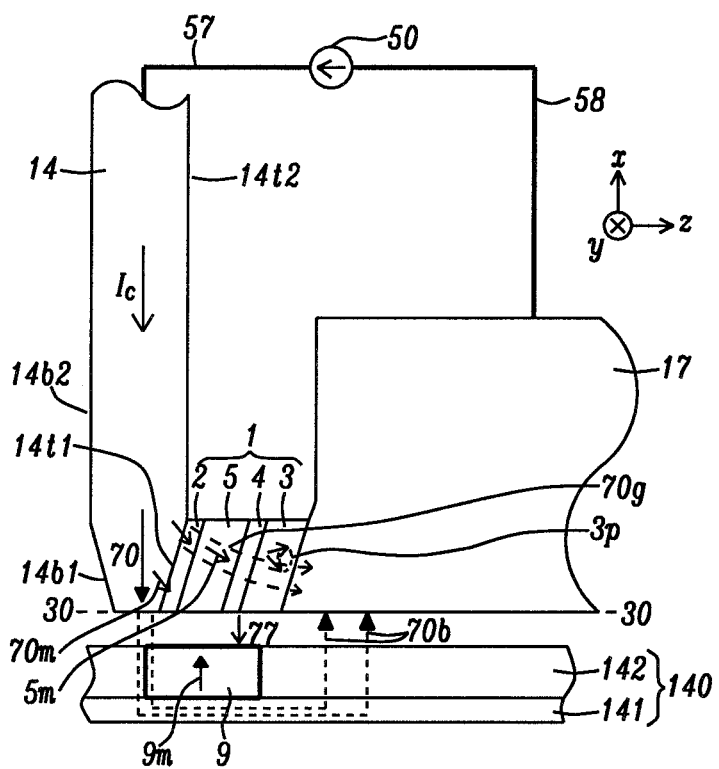

Referring to FIG. 5B, the microwave assisted magnetic recording aspect involves STO device 1 with a first non-magnetic (NM1) spacer 2, spin polarization (SP) layer 5, second non-magnetic (NM2) spacer 4, and FGL 3 sequentially formed on the MP tapered trailing side 14t1. Critical current $I_c$ from a direct current (dc) source 50 is applied through lead 57 to the MP 14 and through STO device 1 to TS 17 and then returns through lead 58 to the dc source. The critical current is spin polarized by the SP layer, and produces a spin torque on the FGL that drives FGL magnetization into a precessional state 3p, which in turn produces a radio frequency (RF) field 77 on bit magnetization 9m. Bit magnetization oscillates in a precessional state (not shown) thereby reducing a coercivity of medium bit 9 so that it can be switched using a smaller MP field 70. Note that SP magnetization 5m and FGL magnetization 3m are parallel in FIG. 5A, and in the precessional state 3p, FGL magnetization remains substantially parallel to SP magnetization and to MP magnetization 70m at the MP interface with NM1 layer 2.

Figure 6A:
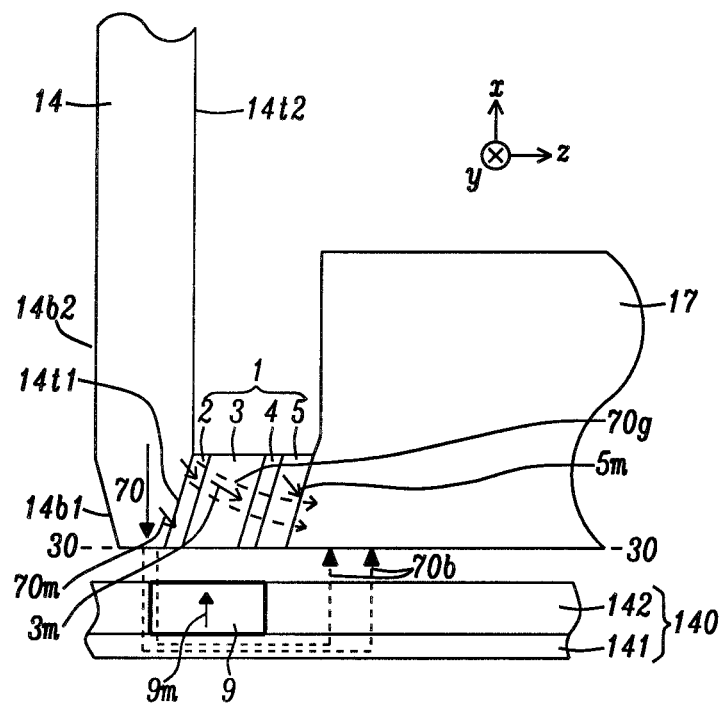

In an alternative STO configuration shown in FIG. 6A, the writer structure and STO layers in FIG. 5A are retained except the positions of SP layer 5 and FGL 3 are switched so that NM1 spacer 2, FGL 3, NM2 spacer 4, and SP layer 5 are sequentially formed on the MP tapered trailing side 14t1. Again, MP magnetization 70m, FGL magnetization 3m, and SP magnetization are substantially parallel and all pointing up (toward TS 17) in the absence of a critical current between the MP and TS.

Figure 6B:
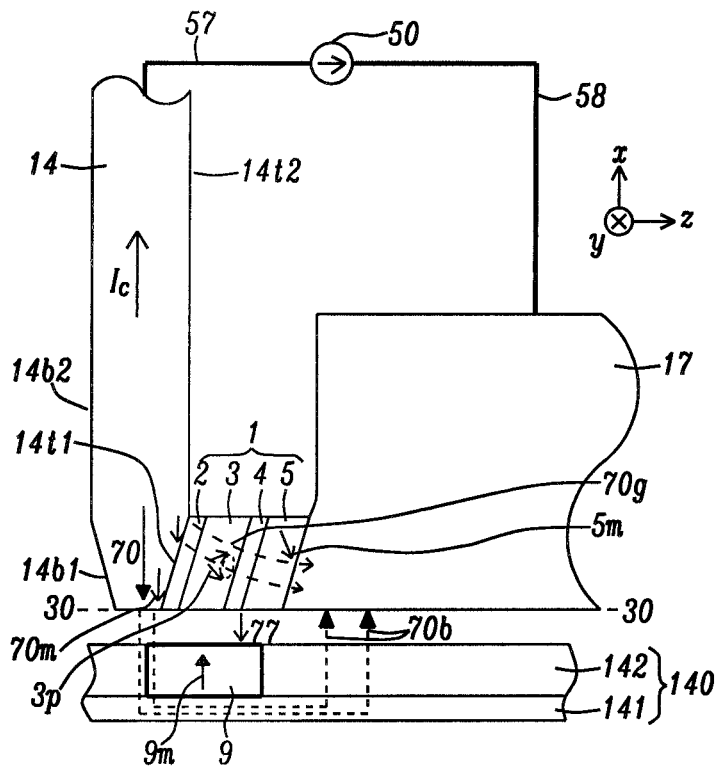

Referring to FIG. 6B, a critical current ($I_c$) is applied from TS 17 to MP 14 during a write process. As a result, the critical current is spin polarized by SP layer 5 and exerts a spin torque on FGL 3 to drive FGL magnetization into a precessional state 3p. A RF field 77 is generated that reduces the coercivity in magnetic bit 9 thereby allowing a smaller MP write field 70 to switch bit magnetization 9m.

In related application HT17-045, we disclosed an alternative STO configuration involving one spin preserving (SP) layer and a FGL. In this case, the applied current ($I_a$) between the MP and FGL is sufficiently greater than $I_c$ such that FGL magnetization flips to an opposite direction (opposite to write gap field 70g) thereby increasing reluctance in the write gap and enhancing the MP field 70 at the ABS.

Figure 7:
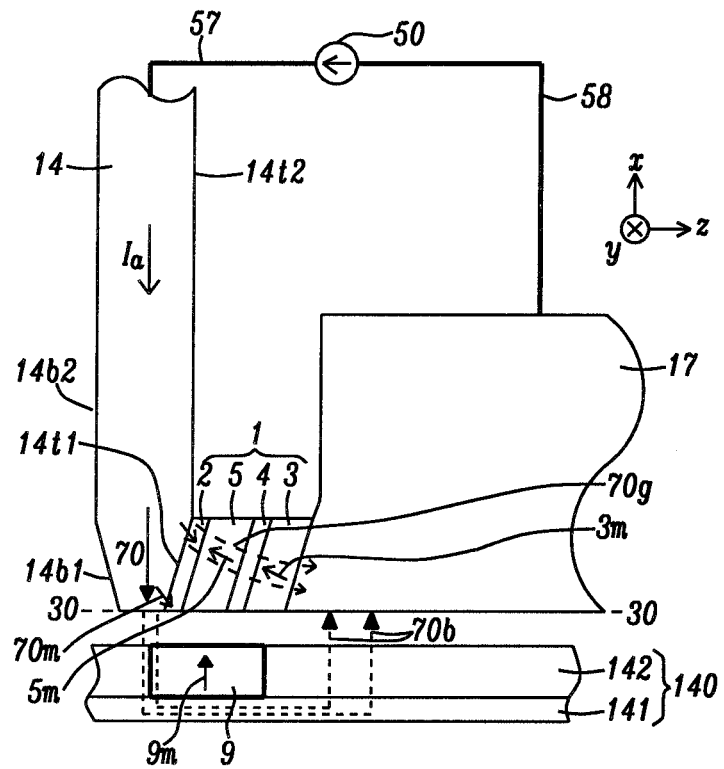
FIG. 7 shows the STO device in FIG. 5B when the applied current is sufficiently large to flip the FGL magnetization to a direction substantially opposite to the write gap field.

In FIG. 7, the current in FIG. 5B is increased to $I_a$ ($I_a > I_c$) according to the concept taught in related application HT17-045. As a result, FGL magnetization 3m has a precessional state (FIG. 8C) and flips to a direction substantially opposite to the write gap field 70g. Since SP layer 5 is the only spin polarization layer, spin torque is applied to the FGL 3 from only one side. Referring to FIG. 8C, the cone angle α for magnetization 3m in the FGL precessional state may vary depending on the magnitude of $I_a$. However, there is typically a trade off between a larger MAMR effect (as the cone angle increases) and an optimum reluctance and MP field enhancement as the cone angle approaches 0 degrees.

As discussed in a later section, the present disclosure discloses a new STO layout wherein spin torque on FGL magnetization is substantially maintained at a given current ($I_a$) density compared with the STO device in related application Ser. No. 16/197,586 where SP layers on opposite sides of the FGL apply an additive spin torque. Moreover, the new STO scheme has AF coupled SP layers that oscillate to provide a MAMR effect to further improve writability.

A key feature of some embodiments of the present disclosure is that a STO device is modified to include AFC SP configuration with a SP1/AF coupling/SP2 stack of layers on an opposite side of the FGL with respect to a first SP layer, and where the SP1 layer is separated from the MP or TS by a seed layer or capping layer, respectively. As a result, SP1 magnetization is decoupled from MP or TS magnetization and enters a precessional state where a current $I_a$ flows across the STO device in a direction from the single SP layer to the AFC SP configuration in order to destabilize FGL magnetization and provide spin-torque-induced FGL flipping to an opposite direction. It is important that the SP1 layer has a larger moment than the SP2 layer and in a direction substantially parallel to FGL magnetization in the absence of applied current.

Another key feature is that the single SP layer magnetization is substantially parallel to FGL magnetization before Ia is applied, and that SP2 layer magnetization is substantially opposite to FGL magnetization prior to FGL flipping. Accordingly, $I_a$ is polarized by the single SP layer and by the SP2 layer. When $I_a$ flows in a direction from the single SP layer to the AFC SP configuration, both the SP2 layer and the single SP layer exert an additive destabilizing spin torque on FGL magnetization thereby causing FGL flipping to a direction substantially opposite to the write gap field. Note that when $I_a$ is applied from the AFC SP configuration toward the single SP layer, there is an additive spin torque that stabilizes FGL magnetization and prevents flipping to a direction that is opposite to the write gap field.

Figure 8A:
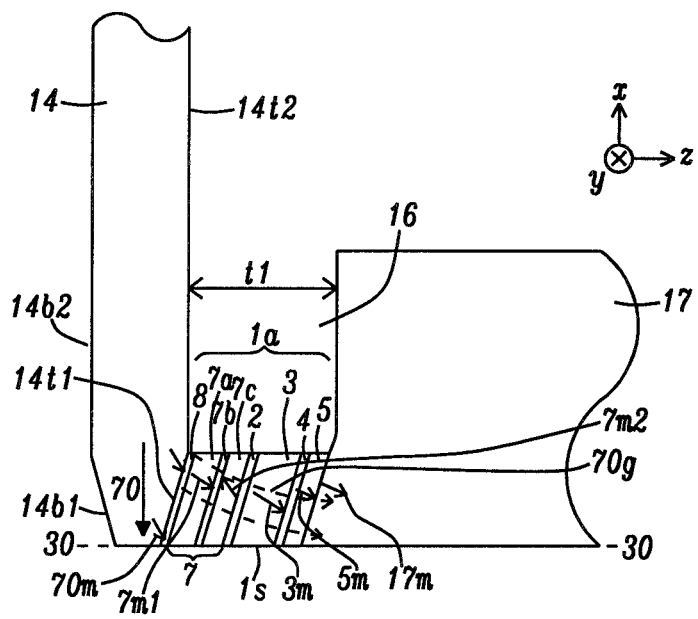
FIGS. 8A-8B depict a first embodiment of the present disclosure wherein a STO device has a top SP layer to provide spin torque assist for FGL magnetization flipping, and a bottom AFC SP layer has a bottommost magnetic layer that is decoupled from the MP and oscillates to provide a MAMR effect.

Referring to FIG. 8A, a first embodiment of the present disclosure is illustrated and comprises STO device 1a having a bottom surface contacting a MP tapered trailing side 14t1 and a top surface adjoining TS 17. The MP and TS structures were described previously. STO device 1a has a front side 1s formed at the ABS in the exemplary embodiment. However, in other embodiments (not shown), the STO front side may be recessed from the ABS. STO device 1a retains all layers described earlier with regard to FIG. 6A, but also includes a bottommost seed layer 8 adjoining MP tapered trailing side 14t1, and an AFC SP layer 7 wherein SP1 layer 7a with magnetization 7m1, AFC layer 7b, and SP2 layer 7c with magnetization 7m2 that is antiparallel to magnetization 7m1 are sequentially formed on the seed layer. It is important that the SP1 layer has a larger moment than the SP2 layer so that magnetization 7m1 is substantially in the direction of write gap field 70g. Thus, in the absence of a dc bias current, magnetization 7m1, is substantially parallel to MP magnetization 70m (at the MP interface 14t1 with SP1, FGL magnetization 3m, and to SP magnetization 5m that are each in a direction pointing substantially up toward TS 17. The TS has magnetization 17m proximate to SP 5, and is ferromagnetically (FM) coupled to the SP layer. Preferably, magnetizations 70m and 7m1 are decoupled since the seed layer 8 has sufficient thickness to prevent FM coupling. Write gap field 70g is generally in the z-axis direction from the MP to TS and across STO device 1a.

Non-magnetic spacers 2 (NM1) and 4 (NM2) may be single layer or multilayer films as appreciated by those skilled in the art, and are preferably a non-magnetic metal with a long spin diffusion length such as Cu, Ag, or Au so that current polarized by the adjacent SP layer 5 and SP2 layer 7c does not encounter strong spin-flip scattering in the spacers. The spacers also prevent strong ferromagnetic coupling between adjoining magnetic layers. In other embodiments, one or both of NM1 and NM2 may be a metal oxide layer. However, metal oxide spacers are generally less preferred because they raise a reliability concern. Seed layer 8 is preferably one or both of Ta and Ru, or may be a multilayer having an uppermost template layer such as NiCr or NiFeCr that promotes uniform thickness in overlying layers, and perpendicular magnetic anisotropy (PMA) in SP1 layer 7a.

Each of SP layer 5, SP1 layer 7a, SP2 layer 7b, and FGL 3 is typically a single element layer that is one of Co, Fe, or Ni, or alloys thereof such as CoFe, NiFe, CoFeNi, or multilayers of the aforementioned single elements and alloys. AFC layer 7b is typically one of Ru, Rh, Ir, Os, V, or Mo with the appropriate thickness to provide antiferromagnetic coupling between the SP1 and SP2 layers. STO device 1a has a down-track thickness t1 that is preferably less than or equal to the thickness of write gap 16.

Figure 8B:
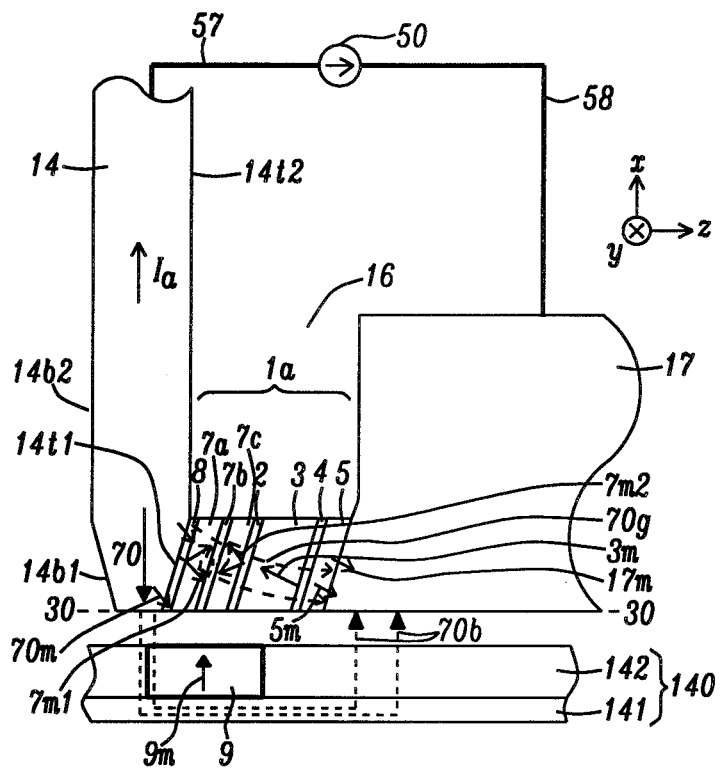
Figure 8C:
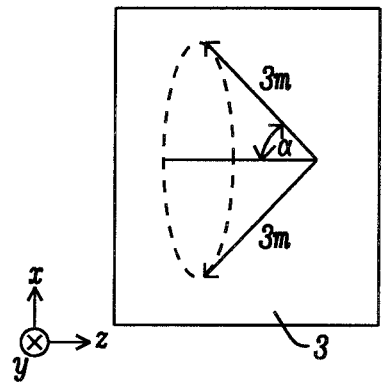
FIG. 8C illustrates a cone angle of a flipped FGL magnetization in a precessional state according to an embodiment of the present disclosure.

Referring to FIG. 8B, dc current $I_a$ from source 50 is applied through lead 58 to TS 17, and then across STO 1a to MP 14 before returning to the source through lead 57. Current Ia is spin polarized by each of SP2 layer 7c and SP layer 5 and has sufficient density to produce an additive (destabilizing) spin torque on FGL magnetization 3m that causes FGL magnetization to flip to a direction substantially orthogonal to the plane of FGL 3 and pointing toward MP tapered trailing side 14t1. The magnitude of $I_a$ and the cumulative spin torque exerted on the FGL determines the degree of FGL flipping. In other words, higher $I_a$ and greater spin torque result in a greater degree of flipping until magnetization 3m realizes a direction essentially orthogonal to MP tapered trailing side 14t1 (cone angle proximate to 0 degrees in FIG. 8C). As the degree of FGL flipping increases, there is greater reluctance in the write gap 16 that reduces write gap field 70g thereby enhancing write field 70 on the magnetic medium (not shown).

Since SP1 layer 7a is decoupled from MP magnetization 70m, current $I_a$ also results in a back flow spin torque from the FGL 3 to AFC SP layer 7 that causes SP1 layer 7a and SP2 layers 7c to oscillate. Accordingly, a RF field is generated primarily by oscillation of magnetization 7m1, but also by oscillation of magnetization 7m2, and induces a precessional state in magnetization 9m in magnetic bit 9 thereby lowering the write field 70 needed to switch the magnetic bit.

Referring to FIG. 8C, FGL magnetization 3m in the flipped state is not in a static state, but is typically in a dynamic state with a precession forming a cone angle α around the z-axis in the opposite direction of write gap field 70g. As indicated previously, when current $I_a$ increases, stronger spin torque will be applied to FGL 3 and the flipped FGL magnetization will have a smaller cone angle meaning that the direction of magnetization 3m will become closer to being orthogonal to MP tapered trailing side 14t1. When the cone angle is 0 degrees (orthogonal to MP side 14t1 and opposite to the write gap field) there is a maximum assist effect to reduce the write gap field and enhance the MP write field 70. However, the FGL will generate essentially no RF field on the magnetic medium when a is proximate to 0 degrees.

Figure 9A:
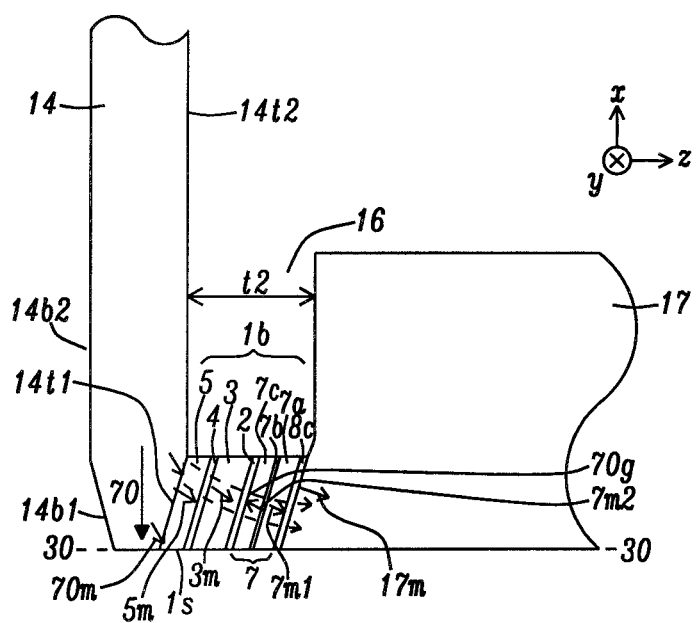
FIGS. 9A-9B depict a second embodiment of the present disclosure wherein a STO device has a bottom SP layer to provide spin torque assist for FGL magnetization flipping, and an upper AFC SP layer with an uppermost magnetic layer that is decoupled from the TS and oscillates to provide a MAMR effect.

In FIG. 9A, a second embodiment of the present disclosure is illustrated and features STO device 1b wherein all magnetic and spacer layers from STO device 1a are retained but the stacking order is different. Moreover, seed layer 8 is replaced with an uppermost capping layer 8c. When the capping layer thickness is the same as that of the replaced seed layer, STO 1b thickness t2=t1. However, if capping layer thickness is greater or lesser than the seed layer in the previous embodiment, then t2>t1, or t2<t1, respectively. Here, SP layer 5, NM2 layer 4, FGL 3, NM1 layer 2, AFC SP layer 7, and the capping layer are sequentially formed on the MP tapered trailing side 14t1. Note that the AFC SP layer has a SP2/coupling layer/SP1 configuration wherein the SP1 layer 7a is the uppermost layer and contacts capping layer 8c while the SP2 layer 7c adjoins a top surface of NM1 spacer 2. Magnetizations 70m, 5m, 3m, and 7m1 are all aligned substantially parallel to each other and point up toward TS 17 in the absence of an applied current across the STO device. SP1 magnetization 7m1 is preferably decoupled from TS magnetization 17m proximate to an upper surface of the STO device because of a sufficient thickness of capping layer. SP2 magnetization 7m2 is anti-parallel to SP1 magnetization 7m1.

Figure 9B:
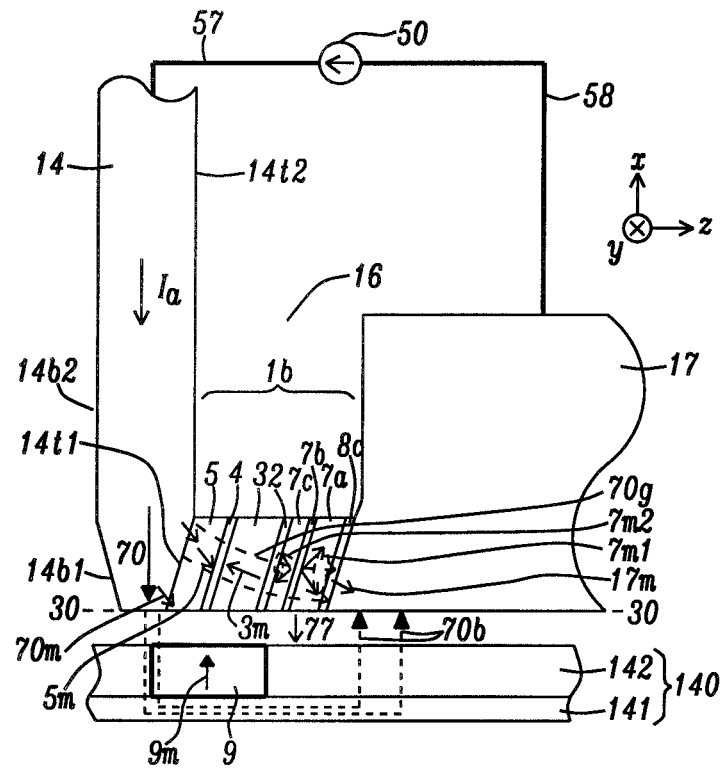

As shown in FIG. 9B, when a current $I_a$ of sufficient magnitude is applied from MP 14 across STO 1b to TS 17, 1a is spin polarized by both SP2 layer 7c and SP layer 5 to generate an additive destabilizing spin torque that causes FGL magnetization 3m to flip to a direction pointing down toward MP tapered trailing side 14t1 and substantially orthogonal to said surface. As mentioned earlier, the degree of FGL flipping depends on $I_a$ magnitude and the additive spin torque from the SP and SP2 layers. In addition, SP1 layer 7a and the SP2 layer oscillate to generate a RF field 77 on magnetic bit 9 thereby lowering the write field 70 required to switch bit magnetization 9m.

Figure 10A:
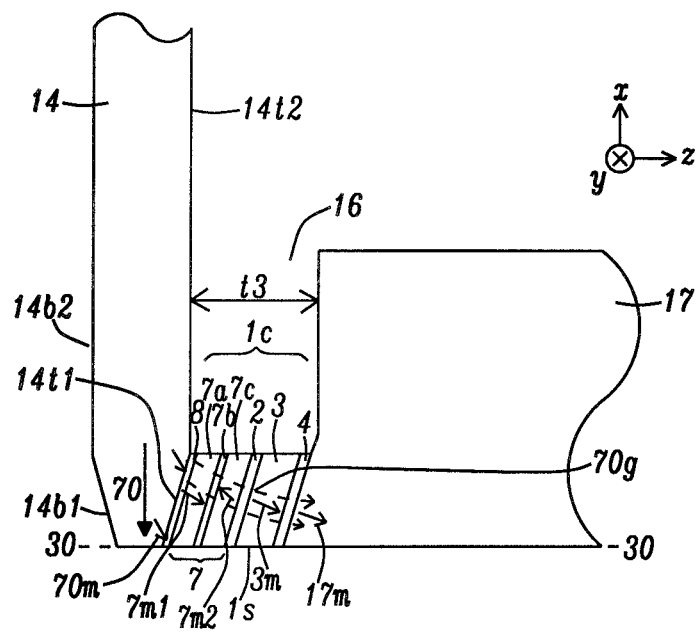
FIGS. 10A-10B depict a third embodiment of the present disclosure that is a modification of the first embodiment wherein the top SP layer is merged into the trailing shield (TS) so that a portion of the TS at the STO top surface provides spin torque for FGL magnetization flipping.

Referring to FIG. 10A, a third embodiment of the present disclosure is depicted as STO device 1c that represents a modification of the first embodiment. In particular, the single SP layer 5 in FIG. 8A is merged into TS 17 so that NM2 4 is the uppermost STO layer. STO thickness is now t3 where t3<t1 because of the removal of the single SP layer. As in the first embodiment, magnetizations 70m, 7m1, and 3m are all aligned substantially in a direction pointing up toward the TS. Furthermore, TS magnetization 17m proximate to NM2 is parallel to FGL magnetization 3m in the absence of an applied current across the STO device. The STO device of the third embodiment has the advantage of allowing a thinner write gap 16 than in the first embodiment.

Figure 10B:
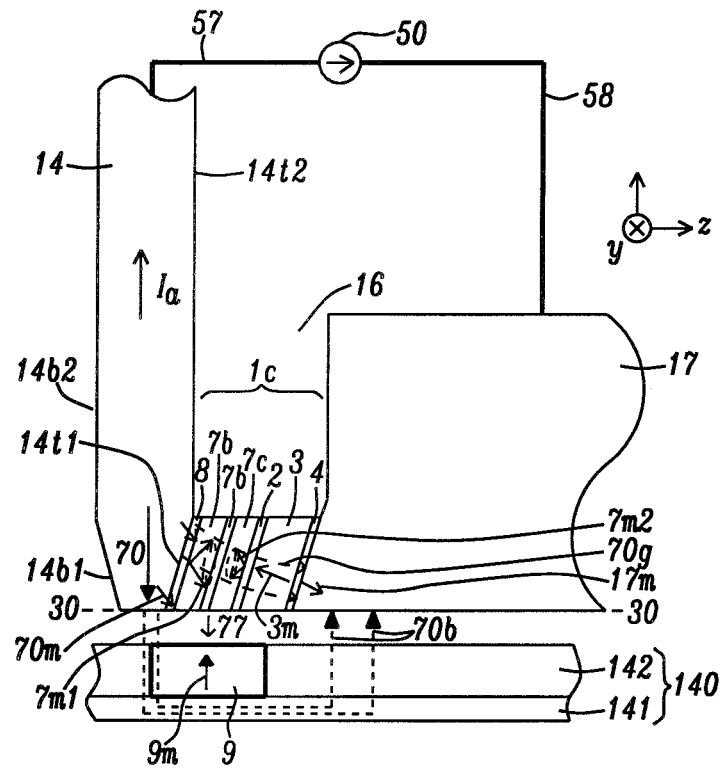

As shown in FIG. 10B, when current $I_a$ is applied from TS 17 to MP 14, FGL magnetization 3m flips to a direction substantially toward MP tapered trailing side 14t1. Spin torque is exerted by the portion of the TS with magnetization 17m proximate to NM2 4, and by SP2 layer 7c, and is an additive destabilizing force on FGL 3 that results in flipping of FGL magnetization 3m, which effectively reduces write gap field 70g, and thereby enhances write field 70. In addition, SP1 layer 7a and in SP2 layer 7c are driven into oscillation states and generate a RF field 77 that induces magnetic bit magnetization 9m to oscillate and reduce the coercivity of magnetic bit 9. Accordingly, a lower write field 70 is required during a write process to switch the magnetic bit, and other selected magnetic bits (not shown).

Figure 11A:
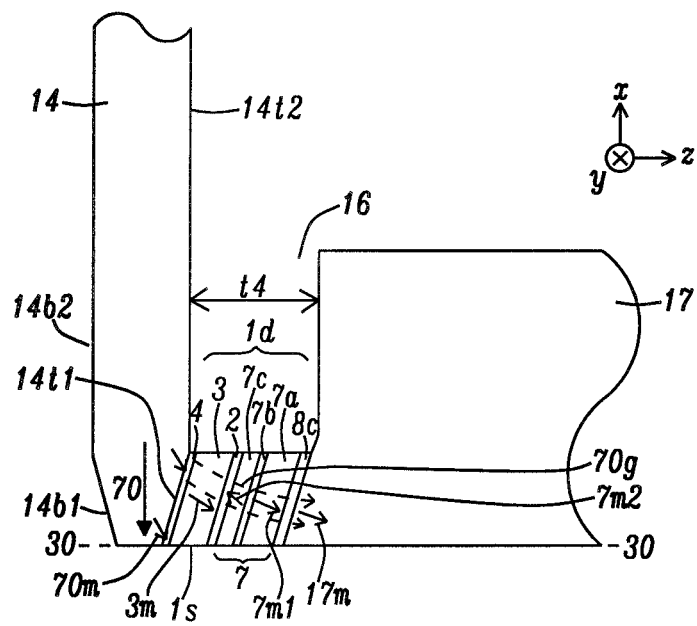
FIGS. 11A-11B depict a fourth embodiment of the present disclosure that is a modification of the second embodiment wherein the bottom SP layer is merged into the main pole (MP) so that a portion of the MP at the STO bottom surface provides spin torque for FGL magnetization flipping.

In FIG. 11A, a fourth embodiment of the present disclosure is shown as STO device 1d that represents a modification of the second embodiment. The single SP layer 5 in FIG. 9A is merged into MP 14 so that NM2 4 is the bottommost layer in the STO device. Thus, the NM2 layer, FGL 3, NM1 2, SP2 7c, AF coupling layer 7b, SP1 7a and capping layer 8c are sequentially formed on MP tapered trailing side 14t1. STO device 1d has thickness t4 that is equal to t3 when the capping layer has the same thickness as that of seed layer 8 in FIG. 10A. Otherwise, when the capping layer thickness is greater or less than that of the seed layer, t4>t3, or t4<t3 respectively. Antiferromagnetic coupling in AFC layer 7 stabilizes SP1 magnetization 7m1 and SP2 magnetization 7m2. The STO device of the fourth embodiment has the advantage of allowing a thinner write gap 16 than in the second embodiment.

Figure 11B:
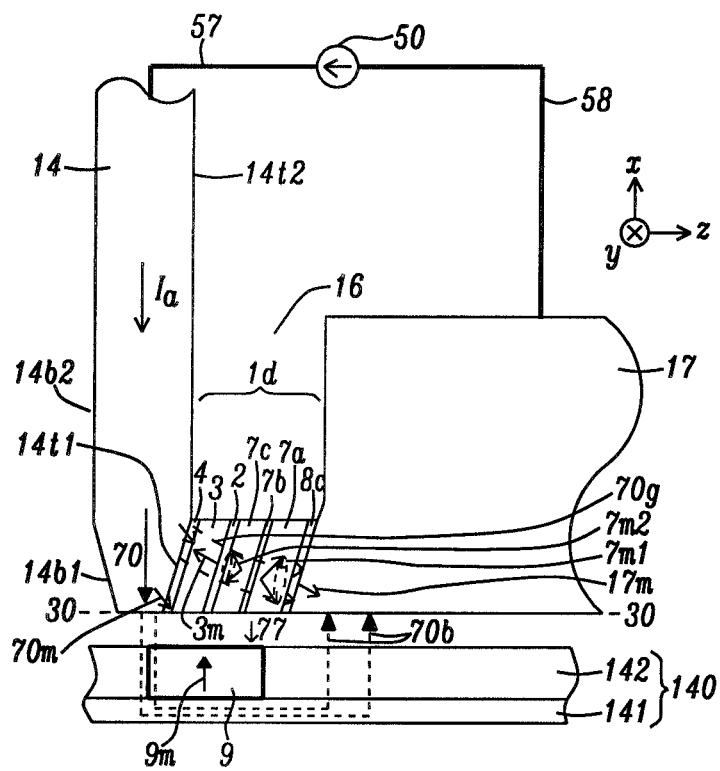

Referring to FIG. 11B, when current $I_a$ is applied from MP 14 to TS 17, FGL magnetization 3m flips to a direction substantially pointing toward MP tapered trailing side 14t1 as a result of an additive destabilizing spin torque from SP2 layer 7c and a portion of the MP 14 with magnetization 70m that is proximate to NM2 4. Accordingly, reluctance is increased in the write gap to reduce write gap field 70g, and enhance write field 70 during a write process. Meanwhile, SP1 magnetization 7m1 and SP2 magnetization 7m2 are driven into oscillation states and generate a RF field 77 on magnetic bit 9, which lowers the write field 70 necessary to switch magnetization 9m in the magnetic bit, and other selected bits.

In all embodiments, the advantage of more efficient FGL flipping at a given current density (compared with the prior art where there is only one SP layer to apply spin torque to the FGL) is associated with a greater write field 70 during writing, and therefore improved bit error rate (BER) and area density capability (ADC) performance. Alternatively, the additive destabilizing aspect of spin torque applied to the FGL 3 from two opposite sides provides the advantage of a reduced $I_a$ to achieve the same extent of FGL flipping compared with only one SP layer in the STO. Accordingly, there will be reduced power consumption and improved STO device reliability since a lower current density will cause less electromigration in metal spacers and reduce the risk of other breakdown mechanisms.

Figure 12:
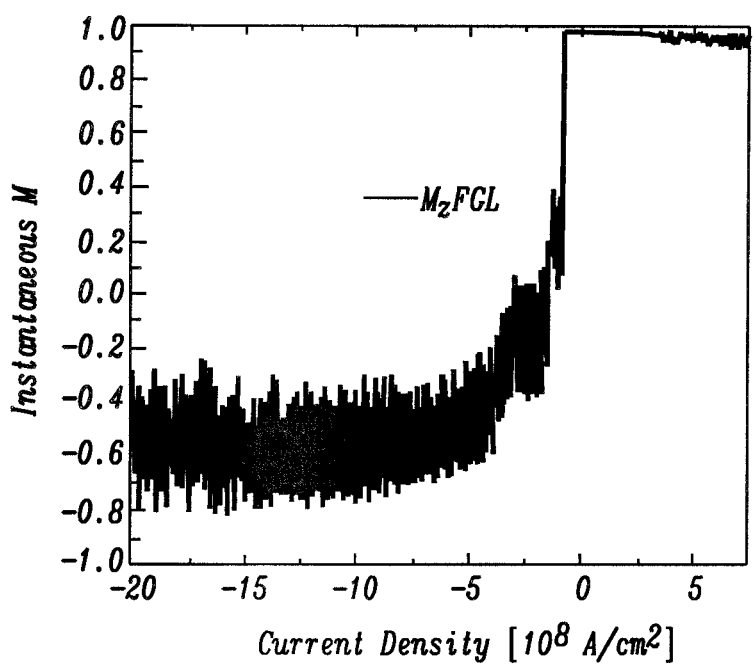
FIG. 12 is a plot of real time simulation of FGL dynamics that shows FGL magnetization as a function of current density.

FIG. 12 plots an example of the real time simulation of FGL dynamics by scanning the current density from $+1 \times 10^9$ Amps/cm$^2$ to $-2 \times 10^9$ Amps/cm$^2$ for 120 nanoseconds (ns) and where positive current direction is defined as electrons flowing from the TS to MP. Mz refers to the FGL magnetization (moment) in the down-track (z-axis) direction. FGL magnetization remains stable under positive and zero current in the write gap (WG) field direction. Once the current density passes approximately $-2 \times 10^8$ Amps/cm$^2$, FGL magnetization 3m (FIG. 8B) starts to flip and is driven into dynamics around the axis opposite to the WG field. As the negative current density increases, the dynamics cone angle becomes smaller, and FGL magnetization is more aligned to the z-axis direction opposite to the WG field. At the same time, the SP1 and SP2 magnetizations remain static until about $-8 \times 10^9$ Amps/cm$^2$, but beyond that current threshold, magnetizations 7m1, 7m2 (i.e. FIG. 8B) are driven into large angle oscillations. SP1 and SP2 oscillations produce a RF field typically having a frequency of 30-40 GHz to provide the MAMR effect.

Although the threshold current density for SP1 and SP2 layers to oscillate is about 4 times higher than the onset of FGL flipping, the polarization parameter of the back flow spin torque from the FGL to SP2 layer may be tuned to lower the threshold current density for SP1 and SP2 oscillation. For example, by increasing the back torque spin polarization parameter from 0.2 to 0.4, the threshold current density for SP1 and SP2 oscillation will be reduced from approximately $-8 \times 10^9$ Amp/cm$^2$ to around $-4 \times 10^9$ Amp/cm$^2$, which is applicable to most metallic STO devices.

Figure 13:
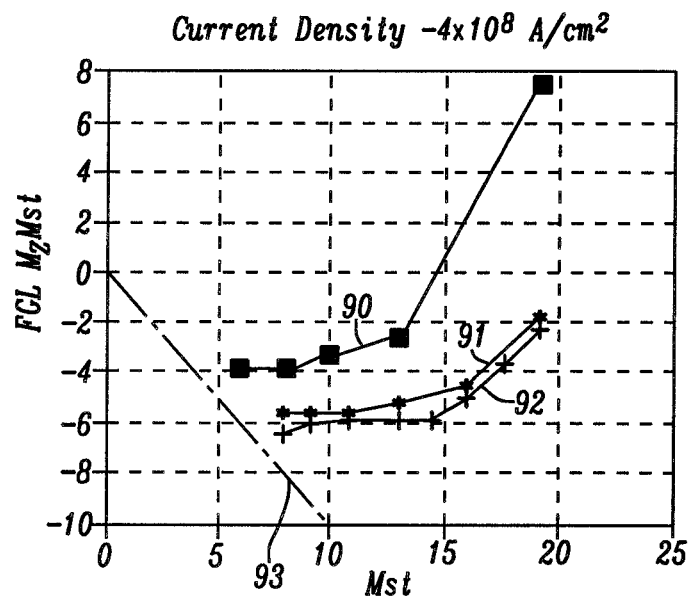
FIGS. 13-15 are plots of the effective flipped FGL magnetization saturation (Mst) vs. the actual FGL Mst for various current densities for a prior art STO device, and a STO device according to the first embodiment described herein.
Figure 14:
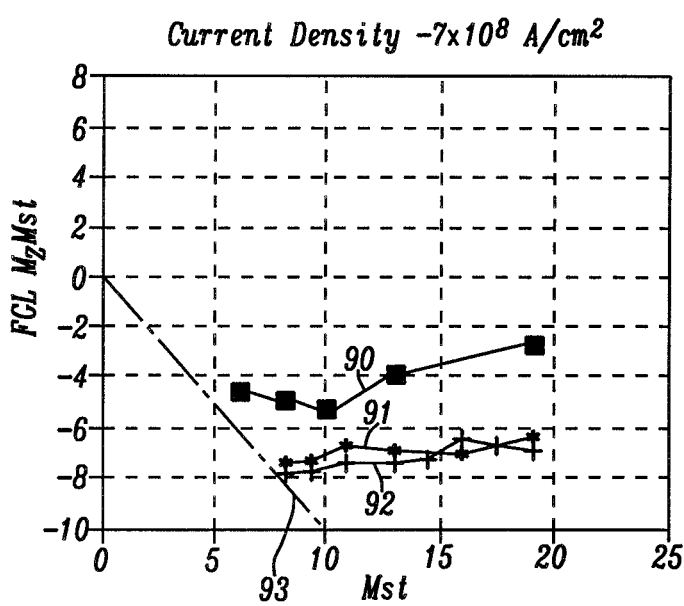
Figure 15:
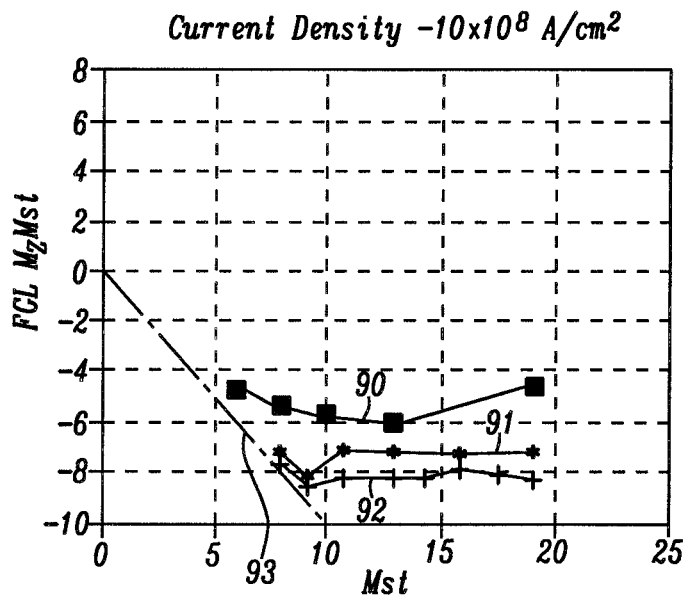

Referring to FIG. 13, the effective flipped FGL Mst (magnetization saturation×thickness), which is approximately proportional to the additional feedback field from the flipped FGL vs. the actual FGL Mst, is plotted for a current density of $-4 \times 10^8$ Amps/cm$^2$. Curve 90 shows the results for a STO device with only one SP layer that was described previously (FIG. 7). Curve 91 illustrates results for the STO device in related application Ser. No. 16/197,586 where spin torque is optimized on the FGL, but there is no MAMR contribution from SP1 and SP2 layers. Curve 92 shows results for STO 1a (FIGS. 8A-8B) formed according to an embodiment of the present disclosure. The dashed line 93 at the lower left corner is the flipping boundary where 100% FGL flipping is achieved. With larger Mst, FGL flipping is smaller but the feedback field per unit flipping is larger. FIG. 14 and FIG. 15 show similar plots where the current density is increased to $-7 \times 10^8$ Amps/cm$^2$ and $-10 \times 10^8$ Amps/cm$^2$, respectively. In all examples (FIGS. 13-15), STO device 1a clearly shows better flipping than a prior art STO device in FIG. 7, and comparable performance to the STO device in related patent application Ser. No. 16/197,586. Therefore, by adding the RF field from SP1 and SP2 oscillation to assist recording, there is no negative impact on the spin-torque-assisted FGL reversal effect to improve the write field.

Figure 16A:
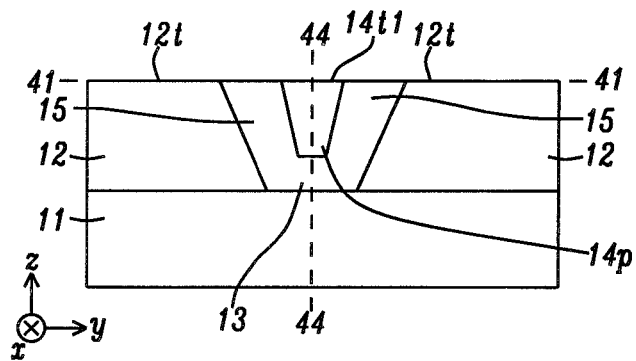
FIG. 16A and FIG. 16B show an ABS view and down-track cross-sectional view, respectively, of a first step in the process of forming a STO device of the present disclosure where a tapered trailing side is formed on the main pole.
Figure 16B:
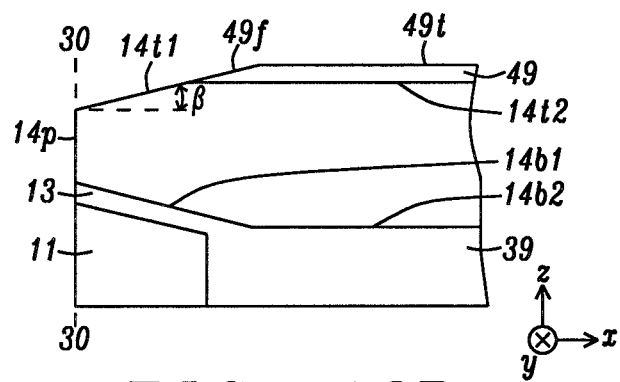

The present disclosure also encompasses a process sequence for fabricating a STO device according to an embodiment described herein and is provided in FIG. 16A through FIG. 21. The partially formed MAMR writer structure including MP tip 14p that adjoins side gaps 15 and leading gap 13 in FIG. 16A is provided according to a conventional process sequence. Side shield top surfaces 12t are coplanar with a trailing edge of the MP tapered trailing side 14t1 at plane 41-41, which is orthogonal to the subsequently formed ABS plane. FIG. 16B shows the down-track cross-sectional view at center plane 44-44 in FIG. 16A. MP tapered trailing side 14t1 has a taper angle β and is coplanar with a tapered front side 49f of dielectric layer 49 made of $Al_2O_3$ or $SiO_2$ that is formed on MP top surface 14t2. Note that the eventual ABS, hereafter referred to as ABS plane 30-30, is not determined until a lapping process is performed after all layers in the writer structure are formed.

Figure 17:
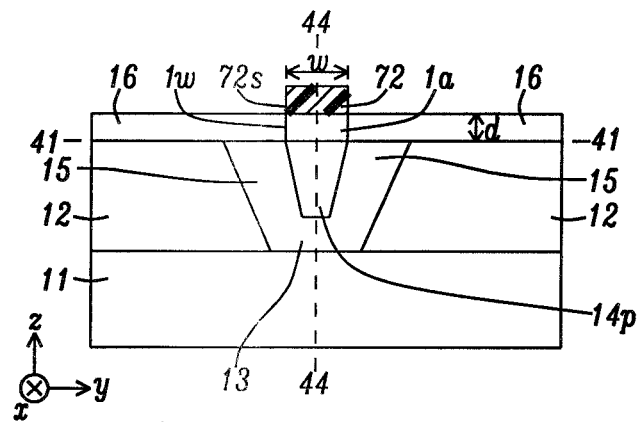
FIG. 17 shows an ABS view of the writer structure in FIG. 16A after a STO layer is deposited and is patterned to establish a cross-track width for the STO layer, and then a write gap is deposited that adjoins the STO sides.

In FIG. 17, a STO stack of layers described previously with regard to the first embodiment is deposited on the MP tapered trailing side 14t1 and on dielectric layer 49. The STO stack of layers is preferably conformal to the underlying topography and has a uniform thickness. Next, a first photoresist layer is coated on the STO stack of layers, and is patternwise exposed and developed to provide a photoresist mask 72 having sides 72s and a cross-track width w that is bisected by center plane 44-44. The photoresist mask pattern is etch transferred through the STO stack of layers using a RIE process, for example, thereby forming STO device 1a with sides 1w separated by width w. In some embodiments, the RIE process may simultaneously generate a backside on STO device 1a. Thereafter, write gap layer 16 with thickness d is deposited on the side shields 12 and side gaps 15.

Figure 18:
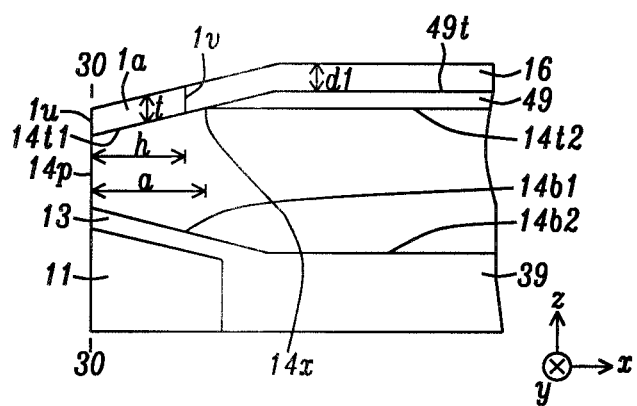
FIG. 18 is a down-track cross-sectional view of the writer structure in FIG. 17 after a second patterning step is used to form a backside on the STO device and a write gap is deposited behind the STO device.

Referring to FIG. 18, a down-track cross-sectional view at center plane 44-44 is depicted for the partially formed writer structure after photoresist mask 72 is removed by a conventional method. STO device 1a has a front side 1u at the ABS plane 30-30, a backside 1v at height h from the ABS plane, and a thickness t. In some embodiments, write gap 16 behind the STO has thickness d1 that may be essentially equal to t. Typically, h is a lesser distance from the ABS plane than edge 14x (at height a) where the MP tapered trailing side 14t1 joins MP top surface 14t2.

Figure 19:
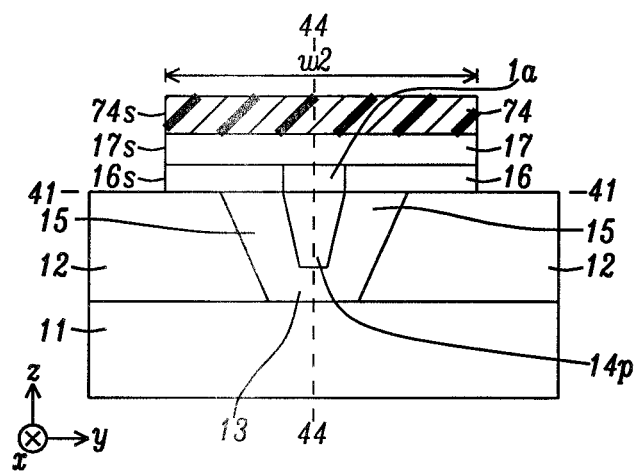
FIG. 19 is an ABS view of the writer in FIG. 18 after a first TS layer is deposited on the STO layer and write gap, and the write gap and first TS layer are patterned to form a cross-track width and uncovers portions of the side shield top surface.

Referring to FIG. 19, the first TS layer 17 is deposited on STO device 1a and on write gap 16, and on side shield top surface 12t. Thereafter, a second photoresist layer is coated on first TS layer 17 and patterned to form photoresist mask 74 having sides 74s and a width w2 where w2>w. A second RIE or an ion beam etch (IBE) is employed to transfer the photoresist mask pattern through exposed portions of the first TS layer and write gap, and stops on side shield top surface 12t at plane 41-41 thereby generating first TS layer side 17s and write gap side 16s on each side of center plane 44-44.

Figure 20:
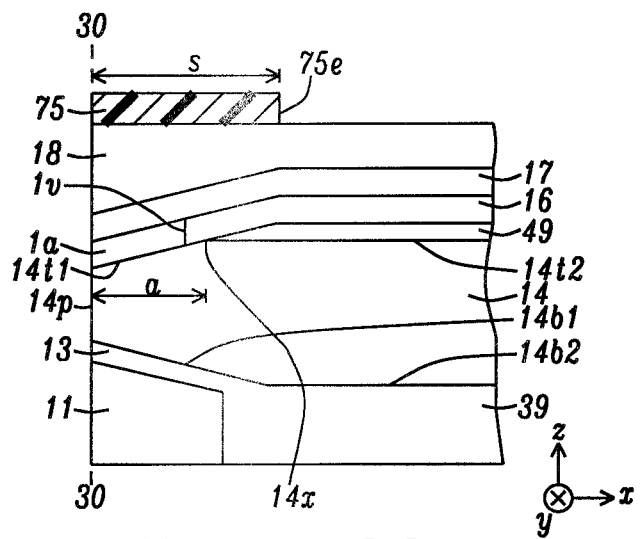
FIGS. 20-21 are down-track cross-sectional views depicting a patterning and etching process, respectively, to establish a backside on each of the first TS layer and the overlying second TS layer according to an embodiment described herein.

Referring to FIG. 20, photoresist mask 74 is removed. Then the second TS layer 18 is deposited on first TS layer 17 and on side shields 12. A third photoresist layer is coated and patterned on the second TS layer to provide photoresist mask 75 having a backside 75e at height s from the ABS plane 30-30 where s is generally larger than height h of MP edge 14x described earlier.

Figure 21:
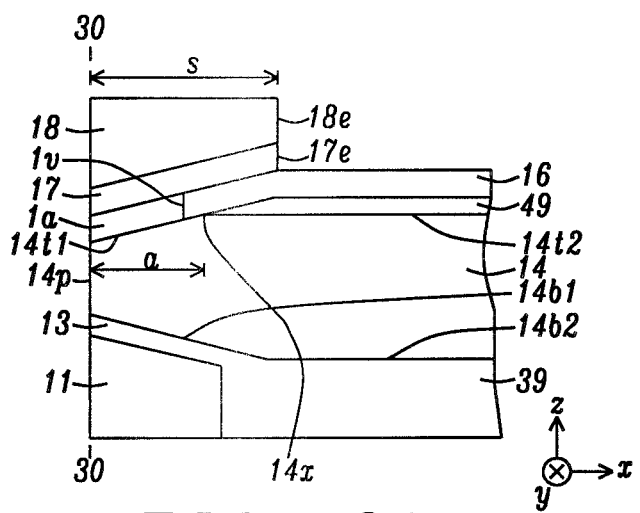

FIG. 21 depicts the partially formed writer structure in FIG. 20 after a third RIE or IBE step is performed to transfer the photoresist mask pattern through exposed regions of the first TS layer 17 and second TS layer 18, and stops at write gap top surface 16t thereby forming first TS layer backside 17e and second TS layer backside 18e at height s from the ABS plane 30-30. Thereafter, a conventional process flow is followed to complete the writer structure. According to one embodiment, a combined read-write head 101 shown in FIG. 4 is formed.

While the present disclosure has been particularly shown and described with reference to, the preferred embodiment thereof, it will be understood by those skilled in the art that various changes in form and details may be made without departing from the spirit and scope of this disclosure.

We claim:

1. A spin transfer torque (STT) assisted magnetic recording structure, comprising:
    (a) a main pole (MP) that is configured to generate a magnetic (write) field which is directed through a pole tip at an air bearing surface (ABS), and to generate a write gap (WG) field in a down-track direction from a MP trailing side across the WG and a spin torque (STO) device into a trailing shield;
    (b) the trailing shield (TS) with a side at the ABS, and a bottom surface facing the MP; and
    (c) the STO device having an uppermost surface contacting the TS bottom surface, and a bottommost surface adjoining the MP trailing side, comprising:
        (1) a field generation layer (FGL) with a magnetization pointing toward the TS and having a lower surface contacting a first non-magnetic spacer (NM1), and an upper surface contacting a second non-magnetic spacer (NM2);
        (2) a first spin polarization (SP) layer that adjoins NM2 and has a first magnetization substantially in a down-track direction toward the TS;
        (3) an antiferromagnetically coupled (AFC) layer having a SP1/AF coupling/SP2 configuration wherein the SP2 layer adjoins a bottom surface of NM1 and has a second magnetization aligned substantially opposite to the first magnetization, and the SP1 layer has a third magnetization antiparallel to the second magnetization and is magnetically decoupled from the MP, and wherein the STO device is configured so that when a direct current ($I_a$) of sufficient magnitude is applied from the TS to MP across the STO device, the first layer and SP2 layer exert an additive destabilizing spin torque on the FGL to cause the FGL magnetization to flip to a direction substantially antiparallel to the WG field thereby increasing reluctance in the write gap, which enhances the write field, and wherein the second and third magnetizations enter a precessional state to generate a RF field that allows a lower magnitude for the write field during a write process.

2. The STT assisted magnetic recording structure of claim 1 further comprising a seed layer formed on the MP trailing side and adjoining a bottom surface of the SP1 layer.

3. The STT assisted magnetic recording structure of claim 1 wherein the third magnetization is greater than the second magnetization.

4. The STT assisted magnetic recording structure of claim 1 wherein one or both of NM1 and NM2 are one of Cu, Ag, Au, or a metal oxide.

5. The STT assisted magnetic recording structure of claim 1 wherein the first SP layer is the uppermost layer in the STO device and is ferromagnetically coupled to the TS.

6. The STT assisted magnetic recording structure of claim 1 wherein the flipped FGL magnetization has a precessional state having a cone angle that decreases with increasing $I_a$ density until shrinking to 0 degrees where reluctance and write field enhancement have an optimum value.

7. A head gimbal assembly (HGA), comprising:
    (a) the STT assisted magnetic recording structure of claim 1; and
    (b) a suspension that elastically supports the STT assisted magnetic recording structure, wherein the suspension has a flexure to which the STT assisted magnetic recording structure is joined, a load beam with one end connected to the flexure, and a base plate connected to the other end of the load beam.

8. A magnetic recording apparatus, comprising:
    (a) the STT assisted magnetic recording structure of claim 1;
    (b) a magnetic recording medium positioned opposite to a slider on which the STT assisted magnetic recording structure is formed;
    (c) a spindle motor that rotates and drives the magnetic recording medium; and
    (d) a device that supports the slider, and that positions the slider relative to the magnetic recording medium.

9. A spin transfer torque (STT) assisted magnetic recording structure, comprising:
    (a) a main pole (MP) that is configured to generate a magnetic (write) field which is directed through a pole tip at an air bearing surface (ABS), and to generate a write gap (WG) field in a down-track direction from a MP trailing side across the WG and a spin torque (STO) device into a trailing shield;
    (b) the trailing shield (TS) with a side at the ABS, and a bottom surface facing the MP; and
    (c) the STO device having an uppermost surface contacting the TS bottom surface, and a bottommost surface adjoining the MP trailing side, comprising:
        (1) a field generation layer (FGL) with a magnetization pointing toward the TS and having a lower surface contacting a second non-magnetic spacer (NM2), and an upper surface contacting a first non-magnetic spacer (NM1);

(2) a first spin polarization (SP) layer that adjoins NM2 and has a first magnetization substantially in a down-track direction toward the TS;

(3) an antiferromagnetically coupled (AFC) layer having a SP2/AF coupling/SP1 configuration wherein the SP2 layer adjoins a top surface of NM1 and has a second magnetization aligned substantially opposite to the first magnetization, and the SP1 layer has a third magnetization antiparallel to the second magnetization and is magnetically decoupled from the TS, and wherein the STO device is configured so that when a direct current ($I_a$) of sufficient magnitude is applied from the MP to TS across the STO device, the first layer and SP2 layer exert an additive destabilizing spin torque on the FGL to cause the FGL magnetization to flip to a direction substantially anti-parallel to the WG field thereby increasing reluctance in the write gap, which enhances the write field, and wherein the second and third magnetizations enter a precessional state to generate a RF field that allows a lower magnitude of the write field during a write process.

10. The STT assisted magnetic recording structure of claim 9 further comprising a capping layer formed on SP1 layer and adjoining the TS bottom surface.

11. The STT assisted magnetic recording structure of claim 9 wherein the third magnetization is greater than the second magnetization.

12. The STT assisted magnetic recording structure of claim 9 wherein one or both of NM1 and NM2 are one of Cu, Ag, Au, or a metal oxide.

13. The STT assisted magnetic recording structure of claim 9 wherein the first SP layer is the bottommost layer in the STO device and is ferromagnetically coupled to the MP.

14. The STT assisted magnetic recording structure of claim 9 wherein the flipped FGL magnetization has a precessional state having a cone angle that decreases with increasing Ia density until shrinking to 0 degrees where reluctance and write field enhancement have an optimum value.

15. A head gimbal assembly (HGA), comprising:
(a) the STT assisted magnetic recording structure of claim 9; and
(b) a suspension that elastically supports the STT assisted magnetic recording structure, wherein the suspension has a flexure to which the STT assisted magnetic recording structure is joined, a load beam with one end connected to the flexure, and a base plate connected to the other end of the load beam.

16. A magnetic recording apparatus, comprising:
(a) the STT assisted magnetic recording structure of claim 9;
(b) a magnetic recording medium positioned opposite to a slider on which the STT assisted magnetic recording structure is formed;
(c) a spindle motor that rotates and drives the magnetic recording medium; and
(d) a device that supports the slider, and that positions the slider relative to the magnetic recording medium.

17. A spin transfer torque (STT) assisted magnetic recording structure, comprising:
(a) a main pole (MP) that is configured to generate a magnetic (write) field which is directed through a pole tip at an air bearing surface (ABS), and to generate a write gap (WG) field in a down-track direction from a MP trailing side across the WG and a spin torque (STO) device into a trailing shield;

(b) the trailing shield (TS) with a side at the ABS, a bottom surface contacting a top surface of the STO device, and having a magnetization proximate to the TS bottom surface that points away from the MP trailing side; and (c) the STO device having a bottommost surface adjoining the MP trailing side, and comprising:
(1) a field generation layer (FGL) with a magnetization pointing toward the TS and having a lower surface contacting a first non-magnetic spacer (NM1), and an upper surface contacting a second non-magnetic spacer (NM2); and
(2) an antiferromagnetically coupled (AFC) layer having a SP1/AF coupling/SP2 configuration wherein the SP2 layer adjoins a bottom surface of NM1 and has a second magnetization aligned substantially opposite to the first magnetization, and the SP1 layer has a third magnetization antiparallel to the second magnetization and is magnetically decoupled from the MP, and wherein the STO device is configured so that when a direct current ($I_a$) of sufficient magnitude is applied from the TS to MP across the STO device, a portion of the TS layer proximate to the STO device and the SP2 layer exert an additive destabilizing spin torque on the FGL to cause the FGL magnetization to flip to a direction substantially anti-parallel to the WG field thereby increasing reluctance in the write gap, which enhances the write field, and wherein the second and third magnetizations enter a precessional state to generate a RF field that allows a lower magnitude for the write field during a write process.

18. The STT assisted magnetic recording structure of claim 17 further comprising a seed layer formed on the MP trailing side and adjoining a bottom surface of the SP1 layer.

19. The STT assisted magnetic recording structure of claim 17 wherein the third magnetization is greater than the second magnetization.

20. The STT assisted magnetic recording structure of claim 17 wherein one or both of NM1 and NM2 are one of Cu, Ag, Au, or a metal oxide.

21. The STT assisted magnetic recording structure of claim 17 wherein NM2 is the uppermost layer in the STO device.

22. The STT assisted magnetic recording structure of claim 17 wherein the flipped FGL magnetization has a precessional state having a cone angle that decreases with increasing Ia density until shrinking to 0 degrees where reluctance and write field enhancement have an optimum value.

23. A head gimbal assembly (HGA), comprising:
(a) the STT assisted magnetic recording structure of claim 17; and
(b) a suspension that elastically supports the STT assisted magnetic recording structure, wherein the suspension has a flexure to which the STT assisted magnetic recording structure is joined, a load beam with one end connected to the flexure, and a base plate connected to the other end of the load beam.

24. A magnetic recording apparatus, comprising:
(a) the STT assisted magnetic recording structure of claim 17;
(b) a magnetic recording medium positioned opposite to a slider on which the STT assisted magnetic recording structure is formed;
(c) a spindle motor that rotates and drives the magnetic recording medium; and (d) a device that supports the slider, and that positions the slider relative to the magnetic recording medium.

25. A spin transfer torque (STT) assisted magnetic recording structure, comprising:
(a) a main pole (MP) that is configured to generate a magnetic (write) field which is directed through a pole tip at an air bearing surface (ABS), and to generate a write gap (WG) field in a down-track direction from a MP trailing side across the WG and a spin torque (STO) device into a trailing shield, and wherein a MP magnetization proximate to the MP trailing side is pointing in a direction toward a trailing shield (TS);
(b) the TS with a side at the ABS, and a bottom surface contacting a top surface of the STO device; and
(c) the STO device having an uppermost surface contacting the TS bottom surface, and a bottommost surface adjoining the MP trailing side, comprising:
(1) a field generation layer (FGL) with a magnetization pointing toward the TS and having a lower surface contacting a second non-magnetic spacer (NM2), and an upper surface contacting a first non-magnetic spacer (NM1); and
(2) an antiferromagnetically coupled (AFC) layer having a SP2/AF coupling/SP1 configuration wherein the SP2 layer adjoins NM1 and has a second magnetization aligned substantially opposite to the first magnetization, and the SP1 layer has a third magnetization antiparallel to the second magnetization and is magnetically decoupled from the TS, and wherein the STO device is configured so that when a direct current ($I_a$) of sufficient magnitude is applied from the MP to TS across the STO device, the a portion of the MP proximate to the MP trailing side and the SP2 layer exert an additive destabilizing spin torque on the FGL to cause the FGL magnetization to flip to a direction substantially anti-parallel to the WG field thereby increasing reluctance in the write gap, which enhances the write field, and wherein the second and third magnetizations enter a precessional state to generate a RF field that allows a lower magnitude of the write field during a write process.

26. The STT assisted magnetic recording structure of claim 25 further comprising a capping layer formed on SP1 layer and adjoining the TS bottom surface.

27. The STT assisted magnetic recording structure of claim 25 wherein the third magnetization is greater than the second magnetization.

28. The STT assisted magnetic recording structure of claim 25 wherein one or both of NM1 and NM2 are one of Cu, Ag, Au, or a metal oxide.

29. The STT assisted magnetic recording structure of claim 25 wherein NM2 is the bottommost layer in the STO device.

30. The STT assisted magnetic recording structure of claim 25 wherein the flipped FGL magnetization has a precessional state having a cone angle that decreases with increasing Ia density until shrinking to 0 degrees where reluctance and write field enhancement have an optimum value.

31. A head gimbal assembly (HGA), comprising:
(a) the STT assisted magnetic recording structure of claim 25; and
(b) a suspension that elastically supports the STT assisted magnetic recording structure, wherein the suspension has a flexure to which the STT assisted magnetic recording structure is joined, a load beam with one end connected to the flexure, and a base plate connected to the other end of the load beam.

32. A magnetic recording apparatus, comprising:
(a) the STT assisted magnetic recording structure of claim 25;
(b) a magnetic recording medium positioned opposite to a slider on which the STT assisted magnetic recording structure is formed;
(c) a spindle motor that rotates and drives the magnetic recording medium; and
(d) a device that supports the slider, and that positions the slider relative to the magnetic recording medium.

33. A method of forming a spin transfer torque (STT) assisted magnetic recording structure, comprising:
(a) providing a main pole (MP) with a tapered trailing side that extends from an air bearing surface (ABS) plane to a first height (a) where the MP tapered trailing side connects with a MP top surface aligned orthogonal to the ABS plane and having a first dielectric layer formed thereon, and wherein the MP is separated from a side shield on each side of a center plane by a side gap;
(b) depositing a STO stack of layers on a top surface of the MP tapered trailing side, first dielectric layer, side gaps, and side shields; the STO stack of layers is bisected by the center plane and comprises:
(1) a field generation layer (FGL);
(2) a first non-magnetic (NM1) layer and a second non-magnetic (NM2) layer that adjoin a bottom surface and top surface, respectively, of the FGL;
(3) a first spin polarization (SP) layer on a top surface of the NM2 layer; and
(4) an AFC SP layer having a SP1/coupling layer/SP2 configuration wherein the SP2 layer adjoins a bottom surface of NM1, and the SP1 layer is magnetically decoupled from the MP;
(c) patterning the STO layer to form a STO device with two sides that are separated by a cross-track width (w), and a backside at a second height (h) where h<a, and depositing a write gap layer on exposed portions of the side gaps and side shields that are not covered by the patterned STO layer;
(d) depositing a first trailing shield (TS) layer on the patterned STO layer and the write gap;
(e) patterning the first TS layer and write gap to form sides thereon, the first TS layer and write gap are bisected by the center plane and each have a width w2 where w2>w; and
(f) depositing a second TS layer on the first TS layer and on exposed portions of the side shields, wherein each of the SP1 layer, SP layer, FGL have a magnetization pointing toward the first TS layer, the SP2 layer has a magnetization that is antiparallel to the SP1 layer magnetization in the absence of an applied field, and wherein the SP1 magnetization is larger than the SP2 magnetization.

34. The method of claim 33 wherein SP1 layer is magnetically decoupled from the MP because the STO stack of layers further comprises a seed layer between the SP1 layer and MP.

35. The method of claim 33 wherein the FGL, first SP layer, SP1 layer, and SP2 layer each have a composition that is selected from a single element layer that is one of Co, Fe, or Ni, or alloys thereof including CoFe, NiFe, CoFeNi, or multilayers of the aforementioned single elements and alloys).

36. The method of claim 33 wherein one or both of NM1 and NM2 are one of Cu, Ag, Au, or a metal oxide.

* * * * *